United States Patent
Clarkson

(10) Patent No.: US 11,022,714 B2
(45) Date of Patent: Jun. 1, 2021

(54) ANTENNA FOR DOWNHOLE COMMUNICATION

(71) Applicant: Weatherford U.K. Limited, Loughborough (GB)

(72) Inventor: Hugh Clarkson, Aberdeen (GB)

(73) Assignee: Weatherford U.K. Limited, Leicestershire (GB)

( * ) Notice: Subject to any disclaimer, the term of this patent is extended or adjusted under 35 U.S.C. 154(b) by 549 days.

(21) Appl. No.: 15/848,377

(22) Filed: Dec. 20, 2017

(65) Prior Publication Data

US 2018/0179887 A1 Jun. 28, 2018

(30) Foreign Application Priority Data

Dec. 23, 2016 (GB) ..................................... 1622186

(51) Int. Cl.
*G01V 3/28* (2006.01)
*E21B 47/13* (2012.01)
(Continued)

(52) U.S. Cl.
CPC ................ *G01V 3/28* (2013.01); *E21B 47/13* (2020.05); *H01Q 7/00* (2013.01); *H04B 5/0031* (2013.01);
(Continued)

(58) Field of Classification Search
CPC .......... H01Q 1/04; H01Q 1/22; H01Q 1/2208; H01Q 1/2216; H01Q 1/2225; H01Q 1/36;
(Continued)

(56) References Cited

U.S. PATENT DOCUMENTS

| 3,568,001 A | 3/1971 | Straus |
| 4,149,764 A | 4/1979 | Mattingly, Jr. |

(Continued)

FOREIGN PATENT DOCUMENTS

| DE | 2426485 A1 | 12/1975 |
| DE | 290738 A5 | 6/1991 |

(Continued)

OTHER PUBLICATIONS

Search Report in corresponding Application No. GB1622186.3, dated May 30, 2017, 6 pages.

(Continued)

*Primary Examiner* — Robert Karacsony
(74) *Attorney, Agent, or Firm* — Blank Rome LLP

(57) ABSTRACT

An antenna 200, 300, 400 and associated systems 1400, 1500 and methods of use of an antenna 200, 300, 400 in downhole communication or detection. The antenna 200, 300, 400 comprises a plurality of planar substrates and wherein at least two of the plurality of planar substrates each comprise at least one conductive coil 830A-J, and the plurality of planar substrates are spaced apart. The system comprises a downhole arrangement defining a throughbore, a primary antenna and a secondary antenna. At least one of the primary and secondary antennae comprise a plurality of planar substrates. At least two of the plurality of planar substrates each comprise at least one conductive coil. The plurality of planar substrates are spaced apart.

16 Claims, 12 Drawing Sheets

(51) Int. Cl.
*H01Q 7/00* (2006.01)
*H01Q 21/00* (2006.01)
*H04B 5/00* (2006.01)
*H05K 1/18* (2006.01)

(52) U.S. Cl.
CPC ............ *H04B 5/0043* (2013.01); *H05K 1/18* (2013.01); *H01Q 21/00* (2013.01); *H05K 2201/10098* (2013.01)

(58) Field of Classification Search
CPC ............ H01Q 1/38; H01Q 7/00; H01Q 7/005; H01Q 7/06; H01Q 7/08; G01V 3/28; G01V 3/30; E21B 47/13
See application file for complete search history.

(56) References Cited

U.S. PATENT DOCUMENTS

| | | | |
|---|---|---|---|
| 4,739,272 A | 4/1988 | Griffin | |
| 4,937,729 A | 6/1990 | Gadreau et al. | |
| 5,206,657 A | 4/1993 | Downey | |
| 5,808,587 A | 9/1998 | Shima | |
| 9,103,197 B2 | 8/2015 | Purkis | |
| 2002/0176229 A1 | 11/2002 | Derian et al. | |
| 2004/0104797 A1 | 6/2004 | Hall | |
| 2004/0263414 A1* | 12/2004 | Chen | G01V 3/28 343/895 |
| 2005/0257961 A1 | 11/2005 | Snell | |
| 2006/0145700 A1 | 7/2006 | Tabanou et al. | |
| 2012/0273192 A1 | 11/2012 | Schmidt et al. | |
| 2013/0181799 A1 | 7/2013 | Deville et al. | |
| 2013/0249663 A1 | 9/2013 | Cho | |
| 2013/0264050 A1 | 10/2013 | Taherian | |
| 2014/0239959 A1* | 8/2014 | Clarkson | E21B 47/13 324/338 |
| 2014/0265565 A1* | 9/2014 | Cooley | H02P 6/18 307/18 |
| 2016/0005526 A1 | 1/2016 | Im et al. | |
| 2016/0258274 A1 | 9/2016 | Bittar et al. | |
| 2017/0030207 A1 | 2/2017 | Kittleson | |

FOREIGN PATENT DOCUMENTS

| | | |
|---|---|---|
| FR | 2640824 A1 | 6/1990 |
| GB | 1440304 A | 6/1976 |
| GB | 2337863 A | 12/1999 |
| GB | 2387033 A | 10/2003 |
| GB | 2403600 A | 1/2005 |
| GB | 2412743 A | 10/2005 |
| JP | S60187044 A | 9/1985 |
| JP | 2000261230 A | 9/2000 |
| JP | 2000269037 A | 9/2000 |

OTHER PUBLICATIONS

Examination Report in counterpart EP Appl. 17208238.0, dated Apr. 26, 2019, 10-pgs.

* cited by examiner

ANTENNA FOR DOWNHOLE COMMUNICATION

FIELD OF THE DISCLOSURE

The present disclosure relates to antennae, and associated systems and methods of use in downhole communication and/or detection, e.g. in an oil and/or gas well.

BACKGROUND OF THE DISCLOSURE

The completion infrastructure in an oil or gas well may comprise a string of downhole tools joined by a string of production tubing to surface. Such downhole tools are generally activated mechanically using a shifting tool attached to a work string to open, close or otherwise shift the position of sliding sleeves.

Typically, a shifting tool is run on a work-string through the completion infrastructure to mechanically actuate the various downhole tools in a desired sequence. Also, in certain circumstances there is a requirement to reliably trigger an activation of a tool when the tool reaches a specific point in the well. Further, there are a number of tools that are either activated by pressure or by mechanical shifting tools which can fail to fully activate as a result of, for example, interference with debris in the wellbore, or premature engagement/disengagement.

It can be difficult to accurately control the operations of the shifting tool and to accurately determine whether an intended actuation has been successful. Moreover, it can be difficult to ascertain information about the degree to which an actuation has occurred. For example, it can be difficult to ascertain the degree to which a sliding sleeve of a particular downhole tool has been shifted.

It is known to employ schemes involving electromagnetic coupling between downhole components. In particular, existing schemes rely upon active electronics (i.e. one or more electronic devices which are configured to electrically control a flow of electrons or an electrical current) for storing and/or communicating information.

Such schemes may, however, be either be prone to failure in the harsh environment of an oil and gas well, or the operating characteristics may vary with variation in the environment of the oil and gas well, impacting the overall reliability of such tools.

As such, there is an industry requirement for a solution to be robust, reliable, and capable of operation within a harsh downhole environment, which may comprise extremes of pressure, temperature and vibration, in addition to exposure to corrosive fluids and gases. Further, there is an industry requirement that any such solution must be cost effective, both in terms of manufacturing costs and operational costs. Directly related to this are the requirements for any such solution to require minimal operator skills and manufacturing skills to operate and manufacture the solution respectively.

The reliability of a solution is important, particularly for systems that may be located permanently or semi-permanently downhole. It is an object of at least one embodiment of at least one aspect of the present disclosure to seek to address one or more problems and/or disadvantages in the prior art.

SUMMARY OF THE DISCLOSURE

A. First Embodiment

According to a first aspect of the present disclosure there is provided an antenna for use in downhole communication or detection, the antenna comprising: a plurality of planar substrates; wherein at least two of the plurality of planar substrates each comprise at least one conductive coil, and wherein the plurality of planar substrates are spaced apart.

The antenna may be adapted to be provided on a downhole arrangement. The antenna may be adapted to be provided on a downhole arrangement defining a throughbore. The antenna may be adapted to be provided on a tool. The antenna may be adapted to be provided on a tool conveyable or deployable in a downhole arrangement defining a throughbore. The antenna may be adapted to be conveyed or deployed downhole. The antenna may be adapted to be conveyed or deployed downhole. The antenna may be adapted to be conveyed or deployed downhole on a tool conveyable or deployable in a downhole arrangement defining a throughbore.

Some or all of planar substrates may comprise insulators. Alternatively, some or all of the planar substrates may comprise conductor(s) or be conductive. The substantially planar substrates may comprise glass fibre, epoxy laminate, or the likes. The substantially planar substrates may preferably comprise ceramic.

The plurality of planar substrates may comprise substrates for Printed Circuit Boards (PCBs). The plurality of planar substrates may comprise one or more PCB substrates.

The plurality of planar substrates may be FR-4, FR-6, Teflon, P96, VT901 or the likes. The plurality of planar substrates may be an insulated metal substrate such as insulated aluminum or the like. The planar plurality of substrates may comprise a flexible material such as Kapton® or Pyralux® product, or the like. (KAPTON and PYRALUX are registered trademarks of DUPONT ELECTRONICS, INC.) The plurality of planar substrates may comprise Alumina (Aluminum Oxide), Polyimide, PTFE, or the likes. In manufacture, the selection of material will be made according to the conditions of the downhole environment. Preferably, and advantageously, the plurality of planar substrates may comprise ceramic, which is suitable for applications with any of extremes of pressure, temperature, vibrations, exposure to corrosive fluids, high frequency operation, and applications where high reliability and durability is required.

Each planar substrate of the plurality of planar substrates may be substantially circular. Each planar substrate may be substantially disc shaped or may form an annulus. Each planar substrate may be substantially disc shaped with or without a centre cut out. As will be described below, an antenna, such as an active antenna, may comprise at least one such substrate. The radius of a circle forming the outer circumference of a planar substrate may be in the region of 0.01 to 0.5 metres, and more preferably in the region of 0.04 to 0.15 metres. The radius of a circle forming an inner circumference of the planar substrate may be in the region of 0 (i.e. with no cut out) to 0.49 metres, and more preferably in the region of 0.02 to 0.05 metres. Advantageously, such dimensions may permit the antenna to be located within a wellbore, yet not obstruct passage of objects within the wellbore and/or through or within the antenna.

Advantageously, such dimensions may permit the antenna to be moveable within the wellbore without being obstructed by other tools or features of the wellbore or completion string, or other antennae mounted on tools, sleeves, the wellbore or completion string, as will be described below. Further, such dimensions may optimise an electromagnetic coupling between a plurality of antennae.

Alternatively, as will be described below, an antenna, such as a passive antenna, may comprise at least one such substrate wherein the dimensions of the substrate are governed by the dimensions of a wall section of a tubular within which the antenna is to be installed. Such a substrate may have a typical difference of approximately 0.012 metres between an inner diameter and an outer diameter of the substrate. As will be described below, such a substrate may be a part of an antenna assembly, wherein an enclosure of the antenna assembly may have a typical difference of approximately 0.016 metres and 0.02 metres between an inner diameter and an outer diameter of the enclosure. For optimum performance of a passive antenna, the substrate may be a minimum distance from an interior surface of the tubular within which the passive antenna is installed.

The substrate may be at least 10 mm from the interior surface of the tubular within which the passive antenna is installed.

The at least one conductive coil may comprise copper, or an alloy comprising copper. Alternatively, the at least one conductive coil may comprise silver, tin, lead or any other conductive metal. Advantageously, the at least one conductive coil may comprise a metal with high conductivity, such that the at least one conductive coil exhibits a low series resistance, as will be described further below.

The at least one conductive coil may be coated in an insulating material, such as plastic, PTFE, rubber, or the like. Advantageously, a coating may prevent electrical conductivity between adjacent loops of the at least one conductive coil, thus permitting tighter winding of the at least one conductive coil. The coating may also serve to protect the at least one conductive coil from temperature, pressure and corrosive materials, as may typically be present in a downhole environment. Exposure to corrosive fluids may occur as a result of a failure of an enclosure or of an encapsulation of the at least one conductive coil.

The at least one conductive coil may comprise a spiral, e.g. a radial or circular spiral. The at least one conductive coil may comprise an Archimedean spiral. The at least one conductive coil may comprise a Fermat spiral. The at least one conductive coil may comprise a logarithmic spiral. The at least one conductive coil may comprise the involute of a circle. The at least one conductive coil may comprise a polygonal spiral.

A start-point of the spiral may be at a distance from a centre of the spiral that is greater or less than a distance from a centre of the spiral to an end-point.

The at least one conductive coil may comprise a substantially Archimedean spiral, wherein the spiral does not start or end at a central point of the spiral. The at least one conductive coil may wind in a clockwise or a counterclockwise direction. The at least one conductive coil may comprise one or more turns. The at least one conductive coil may be arranged to coil or spiral around an axis. Alternatively or additionally, the at least one conductive coil may be arranged relative to the axis and on the plane, such that the at least one conductive coil does not coil or spiral around the axis.

The axis may be defined as an axis running substantially parallel to a substantially cylindrical wellbore or throughbore, and centred on the centre of the wellbore or throughbore. Alternatively, the axis may be defined as a running substantially parallel to, or central to, a downhole tool, as will be described in more detail below. The axis may be substantially orthogonal to the plane. In use, the axis may be substantially orthogonal to the plane.

The at least one conductive coil may be arranged in a substantially spiraling orientation. Each winding of the at least one conductive coil may be a substantially constant distance from an adjacent winding of the at least one conductive coil.

The at least one conductive coil may comprise wire. The wire may comprise a cross-section that is substantially circular. Alternatively, the at least one conductive coil may comprise a flat wire, track or trace, such that a cross-sectional view of the flat wire, track or trace is substantially oblong or rectangular. The at least one conductive coil may be implemented as foil.

The at least one conductive coil may comprise a plurality of turns. Each winding of the at least one conductive coil may have a curvature which increases towards a centre of the at least one conductive coil. Each winding of the coil may comprise one or more straight sections. Each winding of the at least one conductive coil may extend around a different axis.

A start of the coil may be located a distance from the axis. An end of the coil may be located a greater or lesser distance from the axis. The distance from the axis may be large enough to permit passage of objects to pass through the coil, as will be described in more detail below.

The at least one conductive coil may have a circumferential extent of 30°-150°, 60°-120°, or approximately 90° relative to an axis of a throughbore. Such a circumferential extent of the at least one conductive coils of the antenna may provide a circumferentially more uniform electromagnetic field. The provision of an electromagnetic field is described in more detail below.

The at least one conductive coil may be configured to operate as an inductor in the presence of electrical current within the at least one conductive coil. Similarly, the at least one conductive coil may be configured to operate as an inductor in the presence of an electromagnetic field, such that the at least one conductive coil may absorb electromagnetic radiation from another source of electromagnetic radiation, such as a circuit or another inductor. The at least one conductive coil may be configured to operate as an inductor, such that in the presence of a flow of current within the at least one conductive coil the at least one conductive coil may radiate an electromagnetic field. The radiated electromagnetic filed may be absorbed by another circuit and/or may interfere with another circuit. The at least one conductive coil may be a source of electromagnetic interference.

The antenna may comprise a core, such as an iron core or a ferromagnetic core. The core may be arranged such that the core is located within or surrounded by the at least one conductive coil. That is, the at least one conductive coil may be positioned around the core. Beneficially, the core may increase the inductance of the at least one conductive coil.

The core may be moveable and/or adjustable, such that the amount of the core positioned within the at least one conductive coil may be varied. Beneficially, this may permit control of the inductance of the at least one conductive coil. Advantageously, this may allow tuning of a circuit comprising the at least one conductive coil.

The at least one conductive coil may be configured to have a defined series resistance. The material and dimensions of the coil may be selected to minimise the series resistance of the coil. A low series resistance may advantageously result in a high Q-factor inductor, which is beneficial for use in resonant circuits, as will be described below.

The at least one conductive coil may be arranged or provided on a/one of the substantially planar substrate(s). The at least one conductive coil may be affixed or adhered to a/one of the planar substrate, e.g. by means of printing, etching, adhesion, taping, moulding, soldering or the like.

The at least one conductive coil may be implemented on a planar substrate, wherein the planar substrate is a PCB substrate.

The antenna may comprise a Printed Circuit Board (PCB). The at least one conductive coil may be implemented on the PCB. The antenna may be implemented on the PCB by printing, writing, depositing, etching or otherwise applying an electrically conductive material to the substrate.

The at least one conductive coil may be implemented on the PCB as an electrically conductive track. Advantageously, and depending upon the selected copper weight used on the PCB, a coil implemented on a PCB may exhibit low series resistance in comparison to a traditionally wound coil or inductor, and thus may form a High-Q inductor. A PCB coil is also cheaper and simpler to manufacture than a wire based coil, such as a hand-wound inductor. A coil implemented on a PCB may also exhibit less manufacturing variation. Such a coil may be more robust and less prone to the effects of vibration, pressure and temperature than a wire based coil. In addition, and particularly for PCBs wherein at least a portion of the PCB is gold plated, such a coil may be less prone to the effects of corrosive materials than a wire based coil.

The PCB may comprise a plurality of conductive layers. A conductive layer may comprise at least one conductive coil. The at least one conductive coil on a conductive layer may be arranged to form a pair with at least one conductive coil on another conductive layer. The coils forming a pair of coils may be electrically connected to one another. The end of a coil on a layer of the PCB may be connected to an end of a coil on another layer of the PCB, such that the coils are electrically connected in series. The coils may be arranged such that current flows in substantially the same direction in each coil. The coils may be arranged such that the coils are positioned within the PCB to be substantially facing one another and separated by at least one insulating layer. That is, a first coil of a pair of coils, which is located on a first conductive layer of the PCB, is positioned substantially directly above or below a second coil of the pair of coils, which is located on a second conductive layer of the PCB. The first conductive layer and the second conductive layer may be separated by at least one insulating layer. The first coil of a pair of coils may be electrically connected to the second coil of the pair of coils by a via, a micro-via or the likes. Preferably, an end of the first coil of a pair of coils is electrically connected to an end of the second coil of the pair of coils by a via, a micro-via or the likes such that, in use, current flows in substantially the same direction in each coil. Beneficially, such a circuit serves to connect the coils in series. Further, the arrangement and orientation of the coils, which results in current flowing in substantially the same direction in each coil, serves to create a mutual inductance between the coils, such that, in use, the overall inductance of the pair of coils is greater than the sum of the inductance of the first coil and the second coil in insolation.

The PCB may be implemented as two-layer PCB. The PCB may be implemented as two-layer PCB with at least one conductive coil arranged on each of two conductive layers of the PCB, such as a top-layer and a bottom layer of the PCB.

The PCB may be implemented as multiple-layer PCB, for example a 10-layer PCB. The term '10-layer PCB' makes reference to the quantity of conductive layers within the PCB and does not account for the quantity of planar insulating substrate layers, or additional coatings applied to the PCB. Although the exemplary embodiment defines a 10 layer PCB, the multiple-layer PCB may comprise as few as 2 layers. The multiple-layer PCB may comprise as many layers as the capabilities of the PCB manufacturing process can achieve.

The multiple-layer PCB may comprise at least one conductive coil implemented on each of a plurality of conductive layers. At least one conductive coil on one conductive layer of the plurality of conductive layers may be electrically connected to at least one conductive coil on another conductive layer of the plurality of conductive layers. Such connections may be made with vias or micro-vias. The at least one conductive coil on each conductive layer may be arranged as a pair of coils with an at least one conductive coil on a conductive layer immediately above or below the at least one conductive coil in the multiple-layer PCB.

The at least one conductive coil on each of the plurality of conductive layers of the multiple-layer PCB may be electrically connected in series. In this manner, a large inductance may be realized. Beneficially, the inductance of the antenna may be increased by adding layers to the PCB which has a low impact to the form-factor and cost of the PCB, in comparison to adding further discrete components, such as inductors, to achieve an increase in inductance.

Further, the beneficial effects of mutual inductance between the at least one conductive coil on each of the conductive layers with the at least one conductive coil on another conductive layer increases the overall inductance of the antenna.

In a first arrangement, a pair of coils may be instantiated such that the winding of the first coil on the first conductive layer starts at an outermost loop of the first coil. The innermost loop of the first coil on the first conductive layer may be connected to the innermost loop of the second coil on the second conductive layer by a via or a micro-via. The second coil may instantiated such that the coil winds towards the outermost loop, and in a direction that ensures the flow of current in the first coil and the second coil is in substantially the same direction.

In a second, alternative arrangement, each successive loop of the first coil on the first conductive layer may be connected to a successive loop of the second coil on the second conductive layer. In such a configuration, winding alternates between a first conductive layer and a second conductive layer for each successive loop. Beneficially, the second arrangement may exhibit a lower parasitic capacitance and series resistance than the first arrangement, resulting in an implementation of a higher Q-factor inductor.

Further arrangements of the coils may combine aspects of the first arrangement of the coils and the second, alternative arrangement of the coils. Further arrangements of the coils may comprise more than two coils, or a plurality of pairs of coils.

Advantageously, implementation of a coil on a PCB removes the requirements of a coil to be hand-wound.

The antenna may comprise at least one capacitor. The at least one capacitor may be electrically connected to the at least one conductive coil. The at least one capacitor may be electrically connected in series or in parallel to the at least one conductive coil. The at least one capacitor may be electrically connected in series or in parallel to the at least one conductive coil, thus forming a circuit comprising at least one conductive coil and at least one capacitor. A conductive coil of the at least one conductive coil may be connected in series with another conductive coil of the at least one conductive coil. A conductive coil of the at least one conductive coil may be connected in parallel with another conductive coil of the at least one conductive coil. The capacitor may be a surface-mount capacitor. The capacitor may alternatively be mounted using a through-hole technique, wherein wires of a through-hole capacitor are located through holes in the PCB. The capacitor may be an embedded capacitor. That is, a capacitor embedded within the PCB, or located within a cavity within the PCB.

The capacitor may be an adjustable or variable capacitor. The capacitor may be a ceramic capacitor. The capacitor may be formed upon, within or by the PCB, as will be described in more detail below.

The circuit, comprising the at least one conductive coil and the at least one capacitor, may form an electrical resonator. The circuit may provide a characteristic electromagnetic field, which may be related to the characteristic resonant frequency of the circuit. The circuit may exhibit a characteristic resonant frequency response. The geometry of the at least one conductive coil and/or a configuration of the PCB and/or a size of the capacitor are selected so as to select a characteristic resonant frequency response. Selectable variables in the geometry of the at least one conductive coil may include the number of windings and the length of the wire(s), track(s), trace(s) or foil(s).

The at least one capacitor may comprise at least a portion of each of at least two conductive layers of the multiple-layer PCB. At least one first conductive plate may be implemented on a first conductive layer and at least one second conductive plate may be implemented on a second conductive layer, wherein the first and second conductive layers are separated by at least one layer of PCB substrate and the at least one first conductive plate is positioned such that it at least partly overlaps the at least one second conductive plate when viewed from above or below along the axis. Such a configuration will result in the formation of at least one capacitor. The capacitance of the at least one capacitor may be selected by varying the area of at least one of the conductive plates and/or varying the thickness of the at least one layer of PCB substrate and/or selection of a PCB substrate with a required dielectric constant.

At least one of the conductive plates may be connected in series or in parallel to at least one conductive coil within the multiple-layer PCB. As such, a resonator may be formed.

In a preferred embodiment, the at least one conductive coil within the multiple-layer PCB is electrically connected to the at least one second conductive plate, wherein the at least one first conductive plate is implemented on a conductive layer between the at least one conductive coil and the at least one second conductive plate. Further, in the preferred embodiment, the at least one first conductive plate is positioned such that it at least partly overlaps the at least one second conductive plate when viewed from above or below along the axis and the at least one conductive coil is positioned such that it at least partly overlaps the at least one second conductive plate when viewed from above or below along the axis. Such a configuration has the beneficial effect of effectively increasing the overall area of the first conductive plate that operates as a capacitor. That is, the total capacitance of the at least one capacitor is defined by the sum of the parasitic capacitance defined by the at least one conductive coil and the at least one first conductive plate and the capacitance defined by the at least one first conductive plate the at least one second conductive plate. Advantageously, due to the resultant effective increase in capacitor plate surface area, a larger capacitance can be achieved without having to increase the surface area of the PCB or add additional layers to the PCB.

The antenna may comprise a plurality of PCBs.

At least two of the plurality of PCBs may be substantially aligned along an axis.

The axis may be orthogonal to a surface of one of the at least two of the plurality of PCBs. The at least two of the plurality of PCBs may be centred on a common axis and aligned along a common axis. The surface of one of the at least two of the plurality of PCBs may be substantially parallel to a surface of the other of the at least two of the plurality of PCBs. The surface of either of the at least two of the plurality of PCBs may be a surface parallel to a layer of the at least two of the plurality of PCBs comprising a conductive coil. The surface of either of the at least two of the plurality of PCBs may be a layer of the at least two of the plurality of PCBs comprising a conductive coil.

The plurality of planar substrates or PCBs are preferably spaced apart in planar relation. The plurality of planar substrates or PCBs are preferably spaced with material between each planar substrate or PCB. Such a material may be an elastomeric material and/or a polymeric material and/or a resin and/or a potting compound or the likes. Alternatively, the plurality of planar substrates or PCBs may be spaced with air or an inert gas between each planar substrate or PCB.

The at least two PCBs aligned along the axis may be spaced apart by a distance approximately equal to an outer diameter or an inner diameter of one of the at least two PCBs. The at least two PCBs aligned along the axis may be spaced apart by a distance approximately equal to an outer radius or an inner radius of one of the at least two PCBs. The at least two PCBs aligned along the axis may be spaced apart by a distance approximately equal to a mid-point between an inner diameter and an outer diameter of one of the at least two PCBs. The at least two PCBs aligned along the axis may be spaced apart by a distance approximately equal to an inner or outer diameter of at least one conductive coil of one of the at least two PCBs.

The at least two PCBs aligned along the axis may be spaced apart by a distance approximately equal to one third of an inner or outer diameter or radius of at least one conductive coil of one of the at least two PCBs. The at least two PCBs aligned along the axis may be spaced apart by a distance approximately equal to a mid-point between an inner diameter and an outer diameter of at least one conductive coil of one of the at least two PCBs. The at least two PCBs aligned along the axis may be stacked such that the at least two PCBs are in direct contact with one another.

A spacing between at least two PCBs aligned along the axis may be selected to be an optimum trade-off between an antenna's capabilities to operate as a Helmholtz arrangement and the antenna's capabilities to operate as a receiver. That is, the optimum configuration for a Helmholtz arrangement (i.e. an arrangement providing a uniform magnetic field) may be a spacing between the at least two PCBs approximately equal to the radius of the at least two PCBs. However, to optimise the antenna's capabilities to operate as a receiver, a spacing between the at least two PCBs may be equal to, less than or greater than a radius of the at least two PCBs. A preferred spacing between the at least two PCBs may be approximately between 0.5 and 1.5 times a radius of the at least two PCBs. A preferred spacing between the at least two PCBs may be approximately between 5 and 75 millimetres.

The antenna may comprise at least three PCBs wherein the at least three PCBs are aligned along the axis. The at least three PCBs may be evenly spaced apart. The at least three PCBs may be unevenly spaced apart. The spacing between any pair of PCBs may be proportional to at least one of an average diameter of the pair of PCBs or an average diameter of at least two coils of the pair of PCBs.

The at least two PCBs and/or any pair of PCBs may be arranged such that current flows through the coils in each PCB in the substantially the same direction.

The at least two PCBs and/or any pair of PCBs may be arranged such that current flows through the coils in each PCB in a different direction.

The antenna may comprise between 2 and 36 PCBs, and more preferably between 12 and 8 PCBs. In one preferred embodiment, the antenna comprises 10 PCBs. In a preferred embodiment of an active antenna, the active antenna comprises 10 PCBs comprising conductive coils, and one PCB comprising at least one connector. In a preferred embodiment of a passive antenna, the passive antenna comprises a single PCB comprising eight layers of coils and two layers of conductive plates.

Each PCB may be substantially the same. Each PCB may be configured differently. The at least one conductive coil of each PCB may be configured to be the same as the at least one conductive coil of another PCB. Each PCB may be configured differently. The at least one conductive coil of each PCB may be configured to be the same as the at least one conductive coil of another PCB.

The antenna may comprise a further PCB, wherein the further PCB comprises at least one electrical contact. The further PCB may or may not comprise a conductive coil. The further PCB may comprise a conductive coil on a same and/or different conductive layer as the at least one electrical contact.

The further PCB may comprise at least one electrical contact on at least two layers. Additionally, or alternatively, at least one electrical contact may be formed on each of at least two of the plurality of PCBs.

The at least one electrical contact may comprise a conductive plate. The at least one electrical contact may comprise a hole, gap or void or indentation. The further PCB may comprise a hole, gap or void or indentation at a location of the at least one electrical contact.

The at least one electrical contact may be conductively connected to the at least one conductive coil of the at least one PCB.

A further electrical contact may be affixed, attached, welded or soldered to the at least one electrical contact, such that a conductive path subsists between the further electrical contact and the at least one electrical contact. The further electrical contact may be suitable for connection to a cable, wire or other electrically conductive component.

The plurality of PCBs, and optionally the further PCB, may be mechanically and/or electrically connected. At least two of the plurality of PCBs, and optionally the further PCB, may be electrically connected. The plurality of PCBs, and optionally the further PCB, may be connected by a connecting member or a plurality of connecting members. A connection may be formed between at least one connecting member and at least one of the plurality of PCBs, or optionally, the further PCB.

The connection may be conductive, such that electrical current may flow between at least one connecting member and at least one of the plurality of PCBs, and optionally, the further PCB. The connection may be formed by adhering, welding, soldering, screwing, or fastening by any other means. The connection may be robust. The connection may provide structural support to the plurality of PCBs and/or electrical connectivity. The connection may be insulating, preventing an electrical connection between the connecting member and the at least one of the plurality of PCBs and/or the further PCB.

The connecting member, or at least one of the plurality of connecting members, and the connections, may provide a conductive path between the at least two of the plurality of PCBs, and/or between at least one of the plurality of PCBs and the further PCB.

The antenna may comprise a plurality of further PCBs. The plurality of PCBs, and optionally the further PCB(s), may be connected in pairs, and/or may be connected in groups.

The connecting member may comprise a PCB. The connecting member may comprise a PCB, wherein the PCB comprises electrical contacts. The connecting member may comprise a rod or a pole. The connecting member may comprise metal, plastic or any other suitably rigid material. The connecting member may be tubular. The diameter of the connecting member may configured such that the connecting member may inserted into a hole in at least one of the plurality of PCBs.

A plurality of connecting members may be radially positioned around an axis, wherein the axis is orthogonal to a conductive layer of the at least one PCB, and wherein the at least one PCB is centred on the axis. The plurality of connecting members may be connected to an inner diameter and/or and outer diameter of the at least one of the plurality of PCBs. The plurality of connecting members may span an entire width of each PCB.

In a preferred embodiment, the antenna may comprise three, four, five or six connecting members. One connecting member may provide electrical connectivity between the plurality of PCBs. The provision of further connecting members provides structural support to the plurality of PCBs during a moulding process.

The plurality of connecting members may be integrated into or formed within an enclosure.

Advantageously, by connecting a plurality of PCBs as described above, such that a plurality of coils are connected to form a circuit, a large inductance may be realised, by virtue of connecting in series a plurality of coils operating as inductors. In addition, an effect of mutual inductance between the plurality of coils may further contribute to an overall inductance of the circuit.

Advantageously, the alignment of a plurality of PCBs as described above, wherein at least two PCBs comprise at least one conductive coil, and wherein the coils are conductively connected may, in use, provide a substantially uniform electromagnetic field. That is, in the presence of a current within the at least one conductive coil, an electromagnetic filed may be generated and/or radiated in a substantially uniform direction relative to the at least one conductive coil.

The electromagnetic filed may be generated and/or radiated with a substantially uniform intensity and/or power relative to the at least one conductive coil.

A pair of the at least two coils may operate as a Helmholtz coil.

Beneficially, this arrangement of a plurality of coils may serve to ensure that an electromagnetic field generated/radiated or absorbed by the plurality of coils is substantially orthogonal or parallel to a field generated/radiated or absorbed by a second coil or plurality of coils.

Further, the length or extent of a substantially uniform portion of the electromagnetic field may be configured by at least one of, or a combination of any of: a quantity of PCBs in the antennal; and/or an alignment of PCBs in the antenna; and/or a spacing between PCBs in the antenna; and/or a configuration, geometry and quantity of coils implemented on PCB of a plurality of PCBs.

Advantageously, by increasing the length of the uniform portion of the electromagnetic filed, the duration in which a plurality of antennae moving relative to one another may be electromagnetically coupled may be increased.

B. Second Embodiment

According to a second aspect of the present disclosure there is provided a system for use in downhole communication or detection, the system comprising: a downhole arrangement defining a throughbore; a primary antenna; and a secondary antenna; wherein at least one of the primary and secondary antennae comprise a plurality of planar substrates; and wherein at least two of the plurality of planar substrates each comprise at least one conductive coil, and wherein the plurality of planar substrates are spaced apart.

In a preferred embodiment, one of the primary and secondary antennae is provided on the downhole arrangement and the other of the primary and secondary antennae is provided in the throughbore, and the primary and secondary antennae are configurable for coupling of an electromagnetic field therebetween.

The primary antenna may be an antenna according to a first aspect. The primary antenna may comprise only a single planar substrate. The primary antenna may be provided with an electrical signal.

The secondary antenna may be an antenna according to the first aspect. The secondary antenna may comprise only a single planar substrate. The secondary antenna may be electronically passive. Beneficially, a passive antenna requires no battery, power supply or additional electronic components or controlling circuitry. As such, a passive antenna, is more robust and more reliable in a downhole environment. The secondary antenna may be incapable of electrically controlling a flow of electrons or an electrical current.

The primary antenna may be electrically active. The primary antenna may be an active antenna.

The secondary antenna may be electrically passive. The secondary antenna may be a passive antenna.

The electromagnetic field may comprise a magnetic field and/or an electric field. Such a system may be beneficial for use in determining a degree of coupling of the electromagnetic field between the primary and secondary antennae.

The secondary antenna may be configured to provide or radiate a characteristic electromagnetic field. The secondary antenna may be configured by means of the geometry of the at least one conductive coil. The secondary antenna may be configured by means of a size of a capacitor. The secondary antenna may be configured by means of a selection of materials and/or material thicknesses of a substrate. The secondary antenna may be configured to provide the electromagnetic field coupled between the first and second antennae with one or more characteristic features.

Detection of a coupled electromagnetic field between the primary and secondary antennae having one or more features which are characteristic of, or are associated with, the secondary antenna may allow the proximity of the secondary antenna to the primary antenna to be detected.

The primary antenna may be positioned or located in the throughbore of the downhole arrangement. The primary antenna may be provided on a tool deployable through the throughbore of the downhole arrangement. The deployable tool may be movable along the throughbore of the downhole arrangement so that the primary antenna passes the secondary antenna.

One of the primary and secondary antennae is adapted to be moved relative to the other of the primary and secondary antennae to align the primary and secondary antenna.

The primary antenna may be provided on a downhole arrangement which defines a throughbore. The primary antenna may extend circumferentially around the deployable tool. The primary antenna may extend completely or partway around the deployable tool. The primary antenna may be affixed to an end of the deployable tool.

The primary antenna may extend around an axis arranged radially relative to a longitudinal axis of the downhole arrangement. Such an orientation of the primary antenna may serve to generate a magnetic field which is directed radially outward towards the secondary antenna of the downhole arrangement. This may serve to enhance any coupling of the electromagnetic field between the primary and secondary antennae.

The primary antenna may be formed separately from the deployable tool and then fitted around the deployable tool. The primary antenna may be formed separately from the downhole arrangement and then fitted around the throughbore defined by the downhole arrangement.

The secondary antenna may be positioned or located in the throughbore of the downhole arrangement. The secondary antenna may be provided on a tool deployable through the throughbore of the downhole arrangement. The deployable tool may be movable along the throughbore of the downhole arrangement so that the secondary antenna passes the primary antenna.

The secondary antenna may be provided on the downhole arrangement which defines the throughbore. The secondary antenna may comprise at least one conductive coil according to a first aspect. The secondary antenna may comprise a capacitor according to a first aspect. The secondary antenna may extend completely around the throughbore of the downhole arrangement. The secondary antenna may be continuous around the throughbore. The secondary antenna may be circumferentially continuous around the throughbore. This may enhance the strength of any coupling of the electromagnetic field between the primary and secondary antennae. This may allow coupling of the electromagnetic field between the primary and secondary antennae if the primary antenna is circumferentially non-continuous.

The secondary antenna may extend part-way around the throughbore of the downhole arrangement. The secondary antenna may extend around an axis arranged radially relative to a longitudinal axis of the downhole arrangement. The secondary antenna may be formed separately from the downhole arrangement and then fitted around the throughbore of the downhole arrangement. The secondary antenna may be formed separately from the deployable tool and then fitted around the deployable tool.

The secondary antenna may be arranged such that the at least one coil is arranged on a plane at 90 degrees to an axis. The axis may be defined as an axis running substantially parallel to the throughbore. The axis may be centred on a centre of the throughbore.

The primary antenna may be configured to be dropped, pumped or otherwise conveyed along the throughbore of the downhole arrangement so that the primary antenna passes the secondary antenna.

The secondary antenna may be configured to be dropped, pumped or otherwise conveyed along the throughbore of the downhole arrangement so that the secondary antenna passes the primary antenna.

The secondary antenna may be configured such that coupling of the electromagnetic field between the primary and secondary antennae as a function of frequency of an electrical signal applied to the primary antenna provides a corresponding measured electrical signal on the primary antenna having a characteristic frequency spectrum. In other words, the secondary antenna may be configured so as to have a characteristic frequency response.

The system may be configured to measure any degree of coupling of the electromagnetic field between the primary and secondary antennae including the case where the primary and secondary antennae are completely uncoupled and the degree of coupling of the electromagnetic field between the primary and secondary antennae is zero.

The electromagnetic field may comprise a time-varying and/or static magnetic field. The electromagnetic field may comprise a time-varying and/or static electric field.

Coupling of the electromagnetic field may comprise inductively coupling the primary and secondary antennae.

The primary and secondary antennae may be configured for alignment along a radial direction relative to a longitudinal axis defined by the throughbore of the downhole arrangement. The primary and secondary antennae may be arranged for coupling of the electromagnetic field therebetween along a radial direction relative to a longitudinal axis defined by the throughbore of the downhole arrangement. The primary and secondary antennae may be configured for alignment in plane orthogonal to a longitudinal axis defined by a throughbore of the downhole arrangement. The primary and secondary antennae may be arranged for coupling of the electromagnetic field therebetween in plane orthogonal to a longitudinal axis defined by a throughbore of the downhole arrangement. The primary and secondary antennae may be configurable for coupling of an electromagnetic field at a frequency in the range of 10 kHz to 1 MHz, 50 kHz to 500 kHz, or 100 kHz to 150 kHz.

Coupling of an electromagnetic field may be possible in such frequency ranges through any wellbore fluids that may be present between the primary and secondary antennae.

The system may comprise a controller. The controller may be electrically coupled to the primary antenna. The controller may be configured to generate and apply an electrical signal to the primary antenna. As such, the primary antenna may be an active antenna. The controller may be configured to measure an electrical signal existing on the primary antenna. The controller may be configured to determine a degree of coupling of the electromagnetic field between the primary and secondary antennae from the measured electrical signal.

The controller may be configured to determine a degree of coupling of the electromagnetic field between the primary and secondary antennae according to a frequency spectrum of the measured electrical signal. The controller may be configured to determine a degree of coupling of the electromagnetic field between the primary and secondary antennae according to the shape of the frequency spectrum of the measured electrical signal.

The controller may be configured to determine a degree of coupling of the electromagnetic field between the primary and secondary antennae according to a resonant feature in the frequency spectrum of the measured electrical signal. The controller may be configured to determine a degree of coupling of the electromagnetic field between the primary and secondary antennae according to a resonant peak or dip in the frequency spectrum of the measured electrical signal.

The controller may be configured to determine a degree of coupling of the electromagnetic field between the primary and secondary antennae according to a shape or Q-factor of the resonant feature. The controller may be configured to determine a degree of coupling of the electromagnetic field between the primary and secondary antennae according to a frequency of the resonant feature. The controller may be configured to log the determined degree of coupling of the electromagnetic field between the primary and secondary antennae in a memory.

The deployable tool may comprise the controller. The downhole arrangement may comprise the controller. The controller may be configured for communication to surface. The controller may be located at surface. The controller may be configured to determine a characteristic frequency response of the secondary antenna.

The system may comprise a power source for providing power to the controller. The deployable tool may comprise the power source. The downhole arrangement may comprise the power source.

A deployable tool which comprises the controller, the power source and the primary antenna may be used to probe or determine a status of a downhole arrangement such as a downhole tool.

The downhole arrangement and/or the deployable tool may comprise a plurality of primary antennae. The downhole arrangement and/or the deployable tool may comprise a plurality of secondary antennae.

The system may comprise a signal generator for applying the electrical signal to the primary antenna during a transmit period. The system may comprise a signal receiver for detecting the electrical signal present on the primary antenna during a receive period.

The signal generator may be configured to apply at least one electrical signal at least one frequency to the primary antenna during the transmit period and the signal receiver may be configured to detect an electrical signal present on the primary antenna during the receive period which is subsequent to the transmit period.

The primary antenna may be, or may operate as, a Radio Frequency Identification (RFID) reader. The primary antenna may be a component of an RFID reader. The RFID reader may communicate with and/or transfer information to and/or from an RFID tag.

The secondary antenna may be, or may operate as, an RFID reader. The secondary antenna may be a component of an RFID reader.

C. Third Embodiment

According to a third aspect of the present disclosure there is provided a method of use of an antenna in downhole communication or detection, the method comprising: providing a primary antenna on one of a downhole arrangement and in a throughbore of the downhole arrangement; and providing a secondary antenna on the other of the downhole arrangement and in the throughbore of the downhole arrangement; wherein at least one of the primary and/or secondary antennae is an antenna according to the first aspect.

The method may further comprise providing a secondary antenna on the other of the downhole arrangement and in the throughbore of the downhole arrangement, wherein the primary and secondary antennae are configurable for coupling of an electromagnetic field therebetween; and aligning the primary and secondary antennae.

Aligning the primary and secondary antennae may comprise moving one of the primary and secondary antennae past the other of the primary and secondary antennae. Aligning the primary and secondary antennae may comprise bringing one of the primary and secondary antennae into proximity with the other of the primary and secondary antennae.

The one of the primary and secondary antennae provided in the throughbore of the downhole arrangement may be provided on a tool deployable within the throughbore.

The method may comprise applying an electrical signal to the primary antenna.

The method may comprise measuring an electrical signal existing on the primary antenna.

The method may comprise measuring a degree of coupling of an electromagnetic field between the primary and secondary antennae from the measured electrical signal.

The method may comprise comparing the electromagnetic field coupled between the primary and secondary antennae with a characteristic electromagnetic field associated with the secondary antenna.

The method may comprise detecting the proximity of the primary and secondary antennae according to whether the electromagnetic field coupled between the primary and secondary antennae matches a characteristic electromagnetic field associated with the secondary antenna.

The secondary antenna may be configured to provide the electromagnetic field coupled between the first and second antennae with one or more characteristic features.

The secondary antenna may have a geometry and/or may be formed from one or more materials to provide the electromagnetic field coupled between the first and second antennae with one or more characteristic features.

The method may comprise detecting the proximity of the primary and secondary antennae according to whether the electromagnetic field coupled between the primary and secondary antennae has one or more features which match the one or more characteristic features of the electromagnetic field associated with the secondary antenna.

The method may comprise logging a measured degree of coupling of an electromagnetic field between the primary and secondary antennae in a memory provided on one of the downhole arrangement and the deployable tool.

The method may comprise communicating a measured degree of coupling of an electromagnetic field between the primary and secondary antennae from one of the downhole arrangement and the deployable tool to the other.

The method may comprise communicating a measured degree of coupling of an electromagnetic field between the primary and secondary antennae from one of the downhole arrangement and the deployable tool to surface.

The method may comprise preventing coupling of an electromagnetic field between the primary and secondary antennae and then, in response to actuation or de-actuation of the downhole arrangement, permitting coupling of the electromagnetic field between the primary and secondary antennae.

The method may comprise permitting coupling of an electromagnetic field between the primary and secondary antennae and then, in response to actuation or de-actuation of the downhole arrangement, preventing coupling of the electromagnetic field between the primary and secondary antennae.

The method may comprise providing the primary antenna on the deployable tool.

The method may comprise providing the secondary antenna on the downhole arrangement.

The method may comprise running the primary antenna past the secondary antenna.

The method may comprise pulling the primary antenna past the secondary antennae using a wireline.

The method may comprise monitoring an electrical signal existing on the primary antenna as the primary antenna is run past the secondary antenna.

The method may comprise determining a frequency spectra of the monitored electrical signal as the primary antenna is run past the secondary antenna.

The method may comprise determining a status of the downhole arrangement from the determined frequency spectra determined as the primary antenna is run past the secondary antenna.

The method may comprise the use of at least one RFID tag, At least one of the primary antenna and the secondary antenna may be a component of an RFID reader, such as an RFID tag reader. The method may comprise the use of at least one RFID tag in communication between surface and a downhole tool. Such RFID tags may have no built-in power supply or battery. Such RFID tags may include active electronics (i.e. one or more electronic devices which are configured to electrically control a flow of electrons or an electrical current) for storing and communicating information to a tag reader. Such RFID tags may include a memory, such as a memory defined on an integrated circuit, for storing information such as a binary code which uniquely identifies the RFID tag.

The method may comprise locating an RFID tag with, or embedding an RFID tag into, a downhole tool which is installed downhole.

Alternatively or additionally, the method may comprise running or conveying an RFID reader downhole, past at least one RFID tag. In response to reading information from the RFID tag, the RFID reader may communicate directly with the downhole tool causing the downhole tool to perform a downhole operation.

Alternatively or additionally, the method may comprise incorporating the RFID reader into a shifting tool which is run or conveyed downhole and which is configured such that, in response to information read from the tag by the RFID reader, the shifting tool acts upon the downhole tool and causes the downhole tool to perform a downhole operation.

Alternatively or additionally, the method may comprise dropping or pumping at least one RFID tag downhole, where an RFID reader reads the stored information from the at least one RFID tag and, in response, actuates a downhole tool thereby causing the downhole tool to perform a downhole operation.

Such RFID tags may harvest energy from an electromagnetic field generated by an RFID reader and may store the harvested energy in the form of charge on a capacitance located within the RFID tag. The charge may be subsequently used to power the RFID tag for the wireless communication of the information stored in the memory of the RFID tag to the RFID reader. For example, the RFID tag may inductively couple the stored information to the RFID reader and/or may radiate the stored information to the RFID reader as an electromagnetic signal.

D. Fourth Embodiment

According to a fourth aspect of the present disclosure there is provided an antenna assembly for use in downhole communication or detection, the antenna assembly comprising: at least one antenna according to the first aspect; and an enclosure.

The enclosure may comprise a plurality of enclosure components. At least one enclosure component may comprise an elastomeric and/or a polymeric material and/or resin. At least one enclosure component may comprise rubber and/or plastics, such as PI, PPS, PTFE, PPA, LCP, PEI, PES, PSU, POM, PA, PET, PBT, TPE, PPE, mPPE, PC or the likes. At least one enclosure component may comprise a high impedance carbon filled black HNBR rubber 90 shore hardness. At least one enclosure component may comprise inert filled non-conductive HNBR rubber at 75 shore hardness. Further, or alternative, grades of rubber may be implemented as required by conditions, such as environmental conditions. At least one enclosure component may comprise thermoplastics.

At least one enclosure component may comprise a polyether ether ketone (PEEK) material. The enclosure may comprise a PEEK shell potted with an epoxy resin. The enclosure may comprise a shell potted cast in a resin. Advantageously, a thermoplastic shell such as PEEK or the likes, or an epoxy potted thermoplastic shell such as PEEK or the likes provides structural stability to the antenna.

A minimum distance between an antenna and a side wall of a tubing that an antenna assembly is located in may be determined by a dimension of the enclosure.

At least one enclosure component may comprise a material that is relatively transparent to an electromagnetic field in a frequency range of operation. At least one enclosure component may comprise a material that is relatively opaque to an electromagnetic field in a frequency range. At least one enclosure component may comprise an inert material. At least one enclosure component may comprise a combination/mixture/blend of any of the aforementioned materials. At least one enclosure component may be formed and/or machined. At least one enclosure component may be molded. At least one enclosure component may be injection molded. At least one enclosure component may be an insulator.

At least one enclosure component may comprise a dielectric material. Provision of a dielectric enclosure may be advantageous because such an enclosure may be selected to modify a wavelength of an electromagnetic signal and modify the efficiency of an electromagnetic transmission or reception.

At least one enclosure component may comprise a material capable of withstanding high temperatures, such as 150° C. or higher, and/or capable of withstanding high pressures, such as 12,000 psia (approximately $82.7 \times 10^6$ Pascal), or 15,000 psia (approximately $103.4 \times 10^6$ Pascal) or 20,000 psia (approximately $137.9 \times 10^6$ Pascal) or higher.

At least one enclosure component may comprise a material capable of withstanding high rates of change of temperature and/or pressure. At least one enclosure component may comprise a colour, pattern and/or decoration, wherein the colour, pattern and/or decoration may indicate a specification or configuration of the antenna. At least one enclosure component may comprise a graded or varying colour, pattern and/or decoration, wherein the graded or varying colour, pattern and/or decoration may indicate a degree of wear of the antenna.

At least one enclosure component may be transparent to visible light. At least one enclosure component may be opaque to visible light.

The use of a mouldable material or resin is advantageous because it can remove the requirement to use other expensive products, such as a PEEK enclosure which may require a separate manufacturing process.

The enclosure may comprise a primary enclosure component. The primary enclosure component may be rigid. The primary enclosure component may provide structural support to the at least one antenna.

The primary enclosure component may be substantially cylindrical. The primary enclosure component may be substantially tubular. The primary enclosure component may be substantially frustoconical.

An interior and/or exterior surface of the primary enclosure component may comprise at least one ridge or shoulder. The at least one ridge or shoulder may be arranged in a plane that is orthogonal to a longitudinal axis of the substantially tubular or cylindrical primary enclosure component.

The ridge or shoulder may have a circumferential extent of 30°-150°, 60°-120°, or approximately 90° relative to an axis of a throughbore. The ridge or shoulder may have a circumferential extent of 360° relative to an axis of the throughbore.

An interior diameter of the primary enclosure component may be substantially constant. The interior diameter of the primary enclosure component may vary across a length of the primary enclosure component.

An interior surface of the primary enclosure component may be uneven and/or notched and/or grooved and/or ribbed and/or substantially non-uniform. Advantageously, a non-uniform surface may improve connectivity of the enclosure to a downhole tool, a wellbore, or the likes. Additionally, a non-uniform surface may increase a friction between the enclosure and a downhole tool, a wellbore, or the likes, mitigation the chances that the enclosure may move or slip from a desired position in use.

An exterior diameter of the primary enclosure component may be substantially constant. The exterior diameter of the primary enclosure component may vary across a length of the primary enclosure component.

An exterior surface of the primary enclosure component may be notched and/or grooved and/or ribbed.

The enclosure may comprise a secondary enclosure component. The secondary enclosure component may be rigid. The secondary enclosure component may provide structural support to at least one PCB. The secondary enclosure component may be substantially cylindrical. The secondary enclosure component may be substantially tubular. The secondary enclosure component may be substantially frustoconical.

An interior and/or exterior surface of the secondary enclosure component may comprise at least one ridge or a shoulder. The ridge or shoulder may be arranged in a plane that is orthogonal to a longitudinal axis of the substantially tubular or cylindrical secondary enclosure component.

The ridge or shoulder may have a circumferential extent of 30°-150°, 60°-120°, or approximately 90° relative to an axis of the throughbore. The ridge or shoulder may have a circumferential extent of 360° relative to an axis of a throughbore.

An exterior diameter of the secondary enclosure component may be substantially constant. The exterior diameter of the secondary enclosure component may vary across a length of the secondary enclosure component.

An exterior surface of the secondary enclosure component may be notched and/or grooved and/or ribbed.

An exterior diameter of the secondary enclosure component may be substantially constant. The exterior diameter of the secondary enclosure component may vary across a length of the primary secondary element.

An interior surface of the secondary enclosure component may be notched and/or grooved and/or ribbed.

At least a portion of an interior surface or an exterior surface of the secondary enclosure component may be threaded. At least a portion of an interior surface or an exterior surface of the primary enclosure component may be threaded. At least a portion of a surface of each of the primary and secondary enclosure components may be threaded such that the primary and secondary enclosure components may be screwed together.

The primary enclosure may be fixably attached to the secondary enclosure by means of any of, or any combination of, adhering, screwing, welding, push-fitting, pressure fitting, or the likes.

The primary and/or secondary enclosure component may be perforated. The primary and/or secondary enclosure component may comprise a hole and/or vent or a plurality of holes and/or vents, such that fluid communication between an exterior and interior surface of the primary and/or secondary enclosure component is permitted. The holes and/or vents may be radially distributed around the enclosure component. Such an arrangement is advantageous because the hole(s) and/or vent(s) may prevent a build-up of fluid pressure from detaching the enclosure from a downhole tool or wellbore, or the likes by overriding a fitting such as a dove-tailed fitting. In use, fluid may enter, or be forced, between an enclosure component and a surface or feature to which it is attached of affixed. The hole(s) and/or vent(s) may provide a conduit, path or route for such fluid to flow, thus mitigating the risk of the fluid causing the enclosure component from detaching the enclosure from a downhole tool or wellbore, or the likes, for example by overriding a fitting.

An exterior surface of the secondary enclosure component may be flared outwards, in a radial direction, orthogonal to the axis, at one or both ends. Advantageously, such a configuration may permit the primary and/or secondary enclosure component to mate or fixably attach to a downhole tool, a casing, a wellbore or the likes. In particular, such a configuration may permit the enclosure to form a connection, such as a dove-tailed connection.

The thickness of the primary and/or secondary enclosure component may be constant, that is, the primary and/or secondary enclosure component may be of a substantially uniform thickness. The thickness of the primary and/or secondary enclosure component may vary, and in particular may vary in proximity to the ridge or shoulder.

At least one antenna according to a first aspect may be attached, connected or otherwise affixed to the primary or secondary enclosure component. The primary or secondary enclosure component may be moulded on to the at least one antenna.

The at least one antenna may be located on, adjacent to, or against the at least one ridge or shoulder of the interior or exterior surface of the primary or secondary enclosure component.

The primary or secondary enclosure component may be moulded onto, within or around the antenna.

The primary enclosure component and the secondary enclosure component may be connected, adhered, moulded, glued on in any way affixed to one another and/or to the at least one antenna, thus forming an assembly.

The primary enclosure and/or the secondary enclosure and/or the assembly may comprise at least one receptacle or socket. The primary enclosure and/or the secondary enclosure and/or the assembly may comprise a pair of receptacles or sockets. Each receptacle or socket may comprise an electrical contact. The at least one receptacle or socket may provide a conductive path between an exterior of the primary enclosure and/or the secondary enclosure and/or the assembly and an antenna within the primary enclosure and/or the secondary enclosure and/or the assembly.

The at least one receptacle or socket may be adapted to form a tight seal with a conductive element or plug. In use, a conductive element, such as a wire or electrical contact, may be electrically connected to the antenna via the at least one receptacle or socket.

The antenna may be hermetically sealed within the enclosure. The antenna may be hermetically sealed within the enclosure with the exception of at least one electrical contact. Advantageously, by hermetically sealing the antenna within the enclosure, the antenna is not directly exposed to an environment within the wellbore and/or fluids/chemicals/gasses that may be present within the wellbore. As such, the antenna may be more robust and may be used multiple times. Existing antenna solutions used in downhole communication or detection typically require replacement of the antenna after every use.

The assembly may be substantially ring shaped. The assembly may be substantially tubular. The assembly may be substantially cylindrical. The assembly may comprise at least one hole and/or vent that fluid may flow through.

The at least one hole and/or vent of the primary and secondary enclosure components may be aligned such that, which implemented in the assembly, fluid may flow through the at least one hole and/or vent of the primary and secondary enclosure components.

The assembly may be configured such that the primary and secondary enclosure components can be detached from one another. Alternatively, and preferably, the assembly may be configured such that the primary and secondary enclosure components cannot be detached from one another.

The assembly may comprise a base plate. The base plate may be located at an end of the first and/or second enclosure component. The base plate may comprise at least one primary hole. The base plate may comprise at least one hole providing a means to form a conductive path between the antenna and a further conductor. The at least one hole may be a socket. The base plate may comprise at least one further hole and/or indentation. The at least one further hole and/or indentations may be radially positioned around the axis.

The at least one further hole and/or indentations may be configured to form a receptacle or socket.

The base plate may be substantially cylindrical. The base plate may be substantially ring shaped. The base plate may be substantially disc shaped, wherein a centre of the disc is the primary hole. The base plate may form an annulus. The base plate may comprise at least one conductive contact providing a means to form a conductive path between the antenna and a further conductor.

The conductive contact may be a pin, rod, plate, pad, plug, or the likes.

The base plate may comprise at least one further rod, pin or the likes. The at least one further rod, pin or the likes may be radially positioned around the axis.

The at least one further rod, pin or the likes may be configured to form a plug.

E. Fifth Embodiment

According to an fifth aspect of the present disclosure there is provided a system according to a second aspect, for use in downhole communication or detection, the system comprising: an antenna assembly according to a fourth aspect.

F. Sixth Embodiment

According to an sixth aspect of the present disclosure there is provided a method of constructing an antenna assembly for use in downhole communication or detection according to a fourth aspect, the method comprising: providing a primary enclosure component; providing a secondary enclosure component; providing at least one antenna; and arranging the primary enclosure component the secondary enclosure component, such that the at least one antenna is substantially enclosed by primary enclosure component the secondary enclosure component.

The method may comprise a two-stage rubber molding process. A first stage of the method may comprise producing a primary enclosure component. The primary enclosure component may be produced by a process of moulding, such as injection molding. Alternatively, the primary enclosure component may be formed by a process of casting. Alternatively, the primary enclosure component may be formed by a process of additive manufacturing, such as "3-d printing".

The method may comprise arranging the primary enclosure component and the antenna, such that the primary enclosure component is in contact with the antenna and, advantageously, provides support to the antenna.

A second stage of the method may comprise producing a secondary enclosure component. The secondary enclosure component may be produced by a process of moulding, such as injection moulding. The secondary enclosure component may be produced by a process of moulding over the primary enclosure component and the antenna. The second stage of the process may comprise an over-moulding stage.

G. Seventh Embodiment

According to a seventh aspect of the present disclosure there is provided a method of use of an antenna assembly in downhole communication or detection according to a fourth aspect, the method comprising: providing a primary antenna on one of a downhole arrangement and in a throughbore of the downhole arrangement; providing a secondary antenna on the other of the downhole arrangement and in the throughbore of the downhole arrangement; wherein the primary and secondary antennae are configurable for coupling of an electromagnetic field therebetween; and aligning the primary and secondary antenna; wherein at least one of the primary and/or secondary antennae is a component of an antenna assembly according to the fourth aspect.

H. Eighth Embodiment

According to an eight aspect of the present disclosure there is provided an antenna for downhole communication or detection, the antenna comprising a planar substrate, wherein the planar substrates comprise at least one conductive coil.

The at least one conductive coil may be a conductive coil according to a first aspect. The planar substrate may be a planar substrate according to a first aspect. The antenna may comprise a PCB according to a first aspect. The antenna may comprise at least one capacitor according to a first aspect.

I. Ninth Embodiment

According to a ninth aspect of the present disclosure there is provided a system for use in downhole communication or detection, the system comprising: a downhole arrangement defining a throughbore; a primary antenna; and a secondary antenna; wherein at least one of the primary and secondary antennae is an antenna according to the first aspect; and wherein the other of the primary and secondary antenna is an antenna according to the eighth aspect.

In a preferred embodiment, one of the primary and secondary antennae is provided on the downhole arrangement and the other of the primary and secondary antennae is provided in the throughbore, and the primary and secondary antennae are configurable for coupling of an electromagnetic field therebetween.

J. Tenth Embodiment

According to a tenth aspect of the present disclosure there is provided a method of use of an antenna for use in downhole communication or detection, the method comprising: providing a primary antenna on one of a downhole arrangement and in a throughbore of the downhole arrangement; and providing a secondary antenna on the other of the downhole arrangement and in the throughbore of the downhole arrangement; wherein at least one of the primary and/or secondary antennae is an antenna according to the first aspect, wherein the other of the primary and/or secondary antennae is an antenna according to the eighth aspect.

In a preferred embodiment, one of the primary and secondary antennae is provided on the downhole arrangement and the other of the primary and secondary antennae is provided in the throughbore, and the primary and secondary antennae are configurable for coupling of an electromagnetic field therebetween.

K. Eleventh Embodiment

According to an eleventh aspect of the present disclosure there is provided a circuit for use in downhole communication or detection, the circuit comprising: a capacitor; and at least one conductive coil according to the first aspect, wherein the capacitor comprises at least a portion of each of at least two conductive layers of a multiple-layer Printed Circuit Board (PCB).

L. Twelfth Embodiment

According to a twelfth aspect of the present disclosure there is provided an antenna for use in downhole communication or detection, the antenna comprising: a plurality of conductive coils according to the first aspect, wherein at least two coils are arranged such that current flows through the coils in substantially the same direction.

M. Thirteenth Embodiment

According to a thirteenth aspect of the present disclosure there is provided a Printed Circuit Board (PCB) for use as an antenna for downhole communication or detection, the PCB comprising a plurality of conductive layers, wherein at least one conductive layer comprises at least one conductive coil. The at least one conductive coil may be a coil according to a first aspect.

N. Fourteenth Embodiment

According to a fourteenth aspect of the present disclosure there is provided a system for use in downhole communication or detection, the system comprising: a Printed Circuit Board (PCB) for use as an antenna, the PCB comprising a plurality of conductive layers, wherein at least one conductive layer comprises at least one conductive coil. The at least one conductive coil may be a coil according to the first aspect.

In a preferred embodiment, one of the primary and secondary antennae is provided on the downhole arrangement and the other of the primary and secondary antennae is provided in the throughbore, and the primary and secondary antennae are configurable for coupling of an electromagnetic field therebetween. The primary antenna may be an antenna according to the eleventh aspect. The secondary antenna may be an antenna according to the eleventh aspect.

O. Fifteenth Embodiment

According to a fifteenth aspect of the present disclosure there is provided a method of use of an antenna in downhole communication or detection, the method comprising: providing a primary antenna on one of a downhole arrangement and in a throughbore of the downhole arrangement; and providing a secondary antenna on the other of the downhole arrangement and in the throughbore of the downhole arrangement; wherein at least one of the primary and/or secondary antennae is an antenna according to the first or any preceding aspect.

It should be understood that the features defined above in accordance with any aspect of the present disclosure or below relating to any specific embodiment of the disclosure may be utilized, either alone or in combination with any other defined feature, in any other aspect or embodiment or to form a further aspect or embodiment of the disclosure.

BRIEF DESCRIPTION OF DRAWINGS

These and other aspects will now be described, by way of example only, with reference to the accompanying drawings, which.

DETAILED DESCRIPTION OF DRAWINGS

Figure 1:
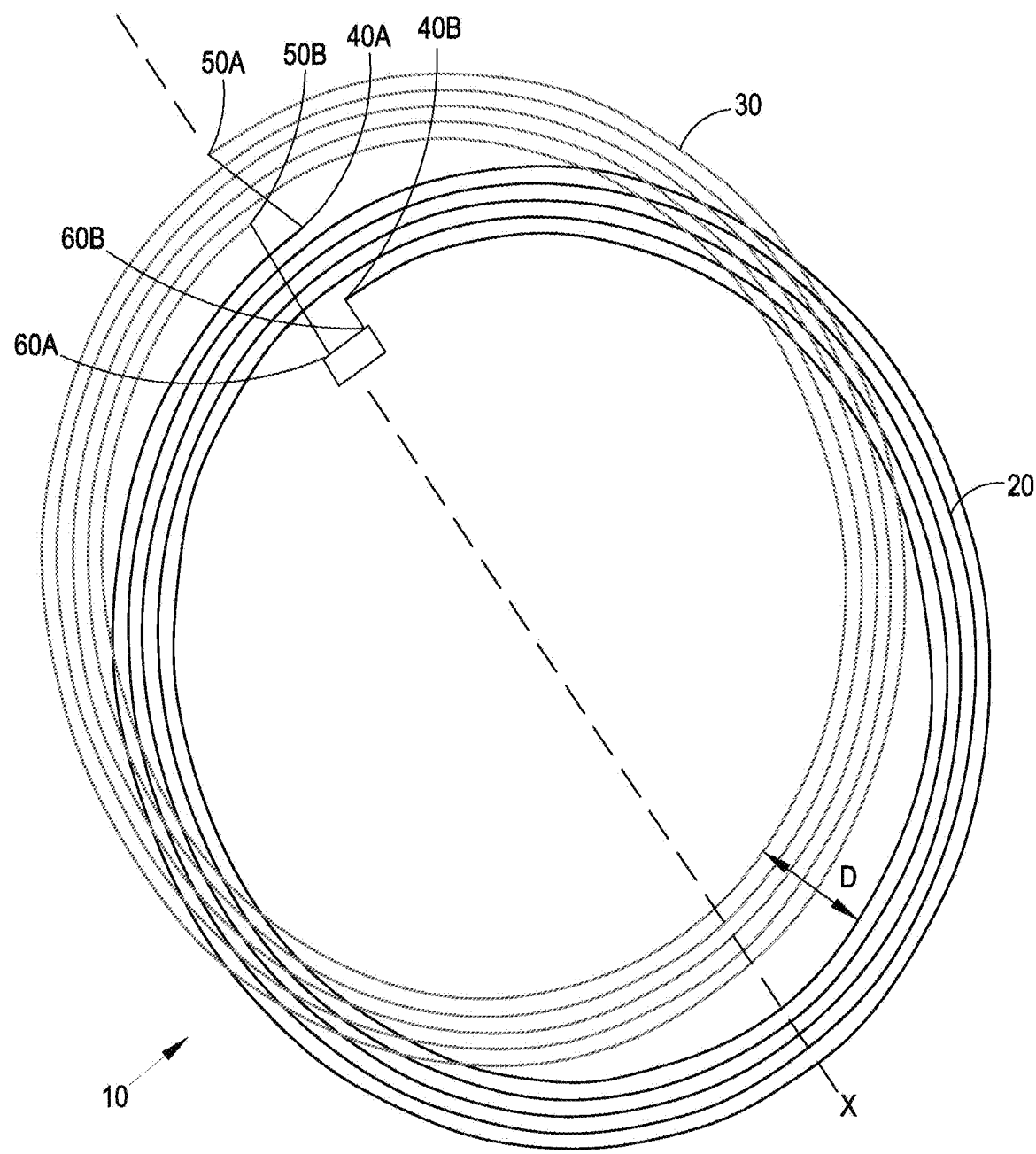
FIG. 1 is a representation of an embodiment of circuit according to a first embodiment of the present disclosure.

Referring firstly to FIG. 1 of the accompanying drawings, there is shown an oblique view of a representation of a circuit 10 according to a first embodiment of the present disclosure. The circuit representation of FIG. 1 is that of a two-layer PCB. That is, each coil is representative of a feature of a conductive layer of a PCB, as will be described in more detail below.

The first coil 20 has a start-point 40A and an end-point 40B. The first coil 20 winds in a clockwise direction from the start-point 40A to the end-point 40B.

The second coil 30 has a start-point 50A and an end-point 50B. The second coil 30 winds in a clockwise direction from the start-point 50A to the end-point 50B.

One of skill in the art would instantly appreciate that in an equivalent embodiment the first coil 20 and second coil 30 could instead be arranged in an opposite orientation such that the first coil 20 could instead wind in an anti-clockwise direction from the start-point 40A to the end-point 40B and the second coil 30 could instead wind in an anti-clockwise direction from the start-point 50A to the end-point 50B.

The first coil 20 and the second coil 30 are arranged such that, when both coils are arranged in the circuit 10, as will be described below, current may flow in substantially the same direction in both coils, i.e. in a substantially clockwise or anticlockwise direction.

The first coil 20 and the second coil 30 are arranged to spiral around an axis X.

The axis X is substantially orthogonal to a plane.

The first coil 20 is arranged substantially on the plane. The first coil 20 is a planar coil.

The second coil 30 is arranged substantially on a plane (not shown) parallel to the plane. The second coil 30 is a planar coil.

The first coil 20 comprises a plurality of turns or windings. Each winding of the first coil 20 has a curvature which increases towards a centre of the first coil 20.

The second coil comprises a plurality of turns or windings. Each winding of the second coil has a curvature which increases towards a centre of the second coil 30.

The first coil 20 has a circumferential extent of 360° relative to axis X.

The second coil 30 has a circumferential extent of 360° relative to axis X.

The first and second coils 20, 30 are spaced apart by a distance D.

The start-point 40A of the first coil 20 is connected to a first terminal 60A of a capacitor 60. The capacitor 60 is used as a tuning capacitor. A characteristic frequency response and/or resonant frequency of the circuit may be configured by selecting a capacitor with a required capacitance.

The end-point 50B of the second coil 30 is connected to a second terminal 60B of the capacitor 60.

The end-point 40B of the first coil 20 is connected to the start-point 50A of the second coil 30.

In the exemplary embodiment of FIG. 1, the first coil 20 has 5 complete turns and the second coil 30 has 5 complete turns. One of skill in the art would recognise that in equivalent embodiments the design may be adapted to include fewer or more turns, or that the turns may not be complete, that is, exhibiting a 360° circumferential extent.

The first and second coils 20, 30 exhibit characteristics of an Archimedean spiral in that a spacing between each winding is constant. That is, each winding of the coil is a substantially constant distance from an adjacent winding of the coil.

Figure 2:
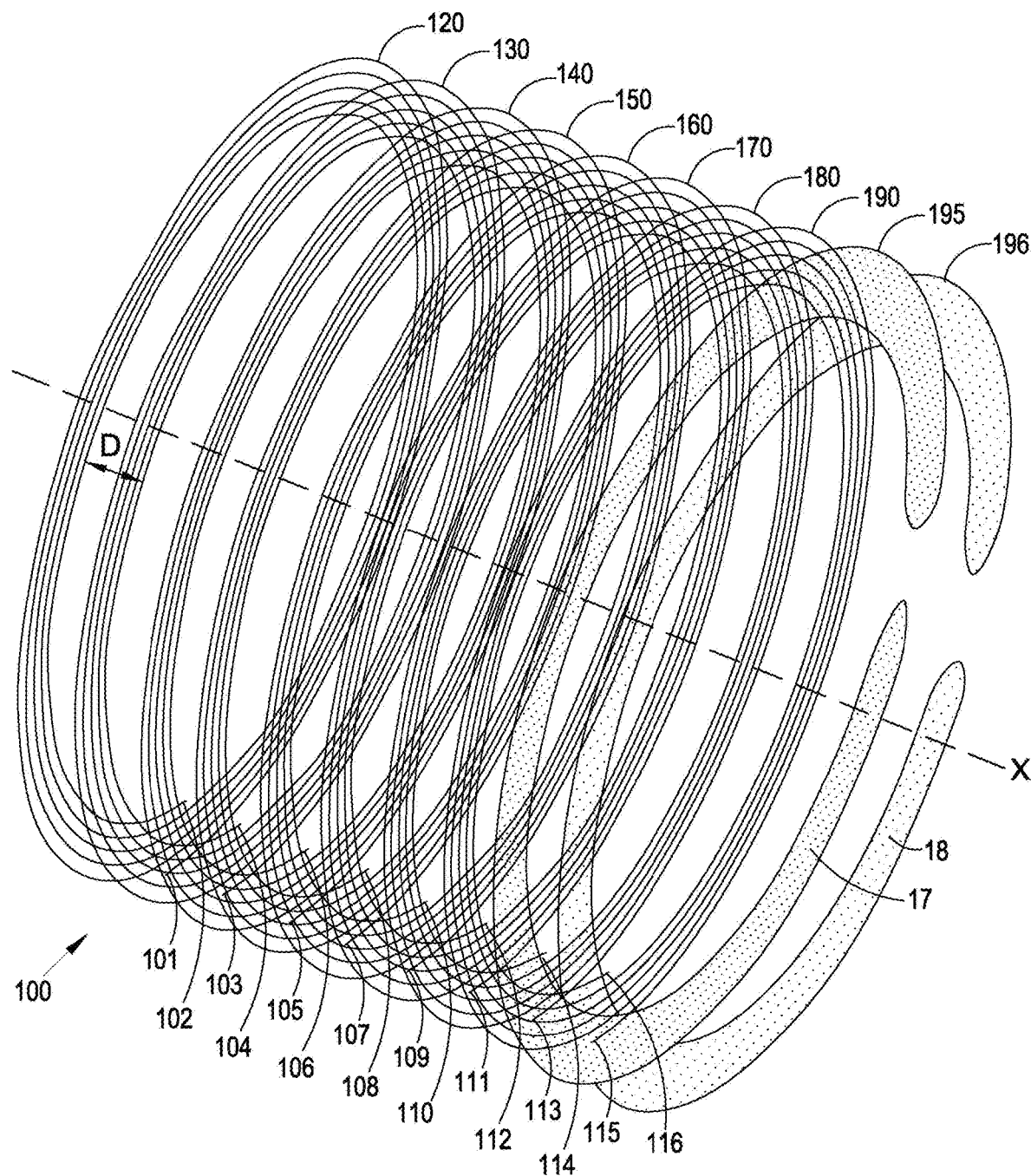
FIG. 2 is a representation of a further embodiment of a circuit according to a first embodiment of the present disclosure.

Referring to FIG. 2 of the accompanying drawings, there is shown an oblique view of a representation of a circuit 100 according to a second embodiment of the present disclosure. The circuit representation of FIG. 2 is that of a multilayer PCB. That is, each coil and each plate is representative of a feature of a conductive layer of a PCB, as will be described in more detail below.

The first coil 120 has a start-point 101 and an end-point 102. The first coil 120 winds in a clockwise direction from the start-point 101 to the end-point 102.

The second coil 130 has a start-point 104 and an end-point 103. The second coil 130 winds in a clockwise direction from the start-point 104 the end-point 103.

The third coil 140 has a start-point 105 and an end-point 106. The third coil 140 winds in a clockwise direction from the start-point 105 the end-point 106.

The fourth coil 150 has a start-point 108 and an end-point 107. The fourth coil 150 winds in a clockwise direction from the start-point 108 the end-point 107.

The fifth coil 160 has a start-point 109 and an end-point 110. The fifth coil 160 winds in a clockwise direction from the start-point 109 the end-point 110.

The sixth coil 170 has a start-point 112 and an end-point 111. The sixth coil 170 winds in a clockwise direction from the start-point 112 the end-point 111.

The seventh 180 has a start-point 113 and an end-point 114. The seventh coil 180 winds in a clockwise direction from the start-point 113 the end-point 114.

The eighth coil 190 has a start-point 116 and an end-point 115. The eighth coil 190 winds in a clockwise direction from the start-point 116 the end-point 115.

One of skill in the art would instantly appreciate that in an equivalent embodiment (not shown), all references to clockwise could instead be anti-clockwise.

The eight coils 120, 130, 140, 150, 160, 170, 180, 190 are arranged such that, when the coils are arranged in the circuit 100, as will be described below, current may flow in substantially the same direction in the coils, i.e. in a substantially clockwise or anticlockwise direction.

The coils 120, 130, 140, 150, 160, 170, 180, 190 are arranged to spiral around an axis X.

The coils are arranged substantially parallel to a plane (not shown), wherein the plane is substantially orthogonal to axis X.

Each coil is arranged substantially on a plane. Each coil is a planar coil.

Each coil comprises a plurality of turns or windings. Each winding of each coil has a curvature which increases towards a centre of each coil.

Each coil has a circumferential extent of 360° relative to axis X.

Each coil is spaced apart by a distance D.

The coils are connected to form a circuit 100. The connections are as described below, but are not shown in FIG. 2 for purposes of clarity.

End-point 102 of the first coil 120 is connected to start-point 104 of the second coil 130.

End-point 103 of the second coil 130 is connected to start-point 105 of the third coil 140.

End-point 106 of the third coil 140 is connected to start-point 108 of the fourth coil 150.

End-point 107 of the fourth coil 150 is connected to start-point 109 of the fifth coil 160.

End-point 110 of the fifth coil 160 is connected to start-point 112 of the sixth coil 170.

End-point 111 of the sixth coil 170 is connected to start-point 113 of the seventh coil 180.

End-point 114 of the seventh coil 180 is connected to start-point 116 of the eighth coil 190.

In the exemplary embodiment of FIG. 2, each coil has 5 complete turns. One of skill in the art would recognise that in equivalent embodiments the design may be adapted to include fewer or more turns, or that the turns may not be complete, that is, exhibiting a 360° circumferential extent.

Each coils exhibits characteristics of an Archimedean spiral, such that a spacing between each winding is constant. That is, each winding of the coil is a substantially constant distance from an adjacent winding of the coil.

As described in relation to FIG. 1, the arrangement of FIG. 2 could be the opposite of what is shown i.e. references to clockwise could be anti-clockwise, and vice-versa.

A first conductive plate 195 is arranged substantially parallel to a plane (not shown), wherein the plane is substantially orthogonal to axis X. A second conductive plate 196 is arranged substantially parallel to a plane (not shown), wherein the plane is substantially orthogonal to axis X. Each conductive plate is arranged around axis X. Each has a circumferential extent of approximately 345° relative to axis X. FIG. 2 is a representation of layers of a multi-layer PCB and, as such, the conductive plates are arranged such that they are separated by at least one layer of PCB substrate.

The first conductive plate is positioned such that it overlaps the second conductive plate when viewed from above or below along axis X. As such, the first and second conductive plates form a capacitor, the capacitance of which is dependent upon the dimensions of the plates, the thickness of the PCB substrate between the plates and the dielectric properties of the PCB substrate.

The second conductive plates is connected to end-point 115 of the eighth coil. (connection not shown). The first conductive plate is connected to the start-point 101 of the first coil 120 (connection not shown). Thus collectively, the coils and capacitor are connected in series to form a resonator. Notably, the eighth coil is electrically connected to the second conductive plate, and the first conductive plate is implemented on a conductive layer between the eighth coil and the second conductive plate. As such, the capacitance in the circuit 100 is increased by virtue of increasing the conductive area that operates as one plate of the capacitor. That is, the total capacitance of the capacitor is defined by the sum of the parasitic capacitance defined by the eighth coil and the first conductive plate and the capacitance defined by the first conductive plate the second conductive plate.

Figure 3:
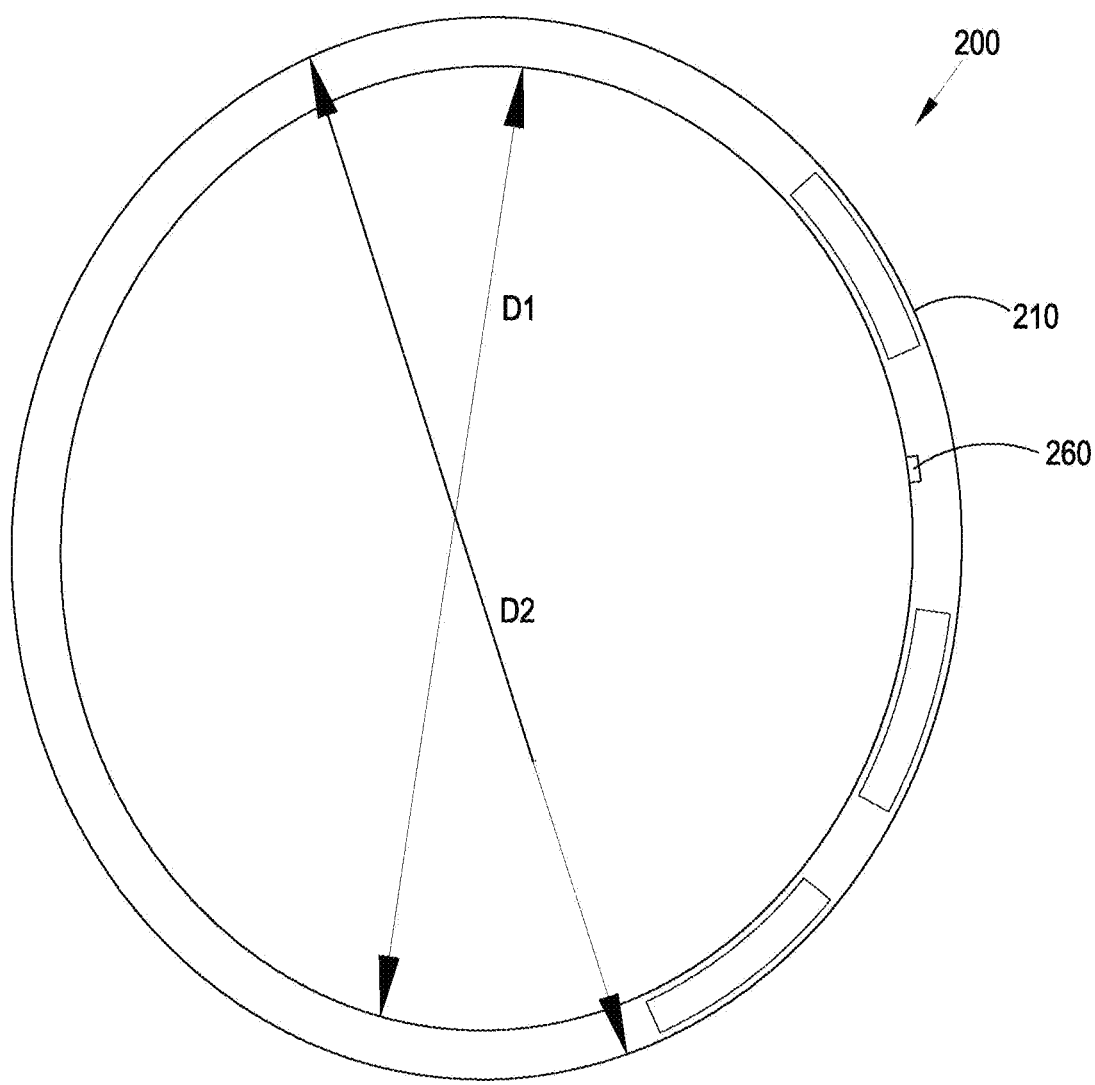
FIG. 3 is a photograph of an antenna implementing elements of the circuits of FIG. 1 and FIG. 2.

FIG. 3 is a photograph of an antenna 200 implementing elements of the circuits of FIG. 1 and FIG. 2. The antenna is implemented by means of a Printed Circuit Board (PCB) 210.

Conductive coils are implemented on the PCB 210 as electrically conductive tracks. The PCB 210 is a multi-layer PCB 210 comprising a plurality of conductive layers (layers not shown), wherein each conductive layer comprises a conductive coil. The conductive coils are arranged as described with reference to FIGS. 1 and 2, wherein current flows in substantially the same direction in each coil. The arrangement and orientation of the coils, which results in current flowing in substantially the same direction in each coil, serves to create a mutual inductance between the coils, such that, in use, the overall inductance of the pair of coils is greater than the sum of the inductance of the first coil and the second coil in insolation.

Capacitor 260 is electrically connected in series the conductive coil on a same layer of the PCB 210 and to a conductive coil on a different layer of the PCB 210 thus forming a circuit comprising the conductive coils and the capacitor 260. The capacitor 260 is a surface-mount capacitor.

The PCB 210 is substantially disc shaped with a centre cut out. That is, the PCB substantially forms a ring shape. An interior diameter D1 of the PCB is substantially constant. An exterior diameter D2 of the PCB is substantially constant.

Figure 4:
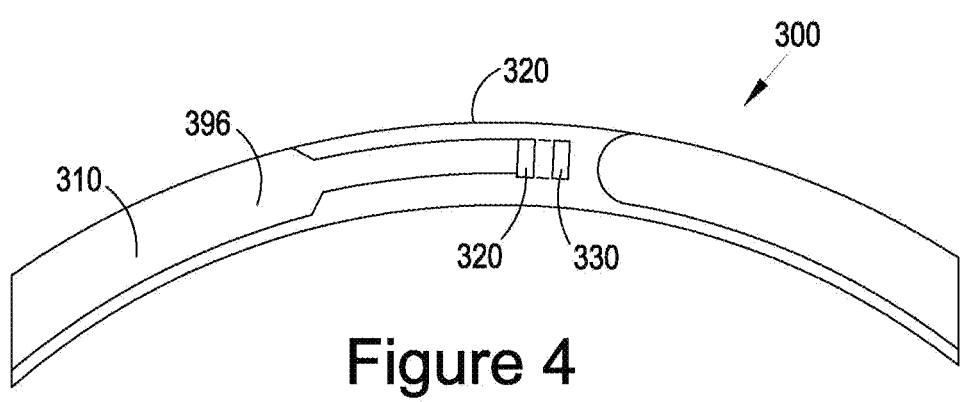
FIG. 4 is a photograph of a further embodiment of a portion of an antenna implementing the circuit of FIG. 2.

FIG. 4 is a photograph of portion of an antenna 300 implementing the circuits of FIG. 2. The antenna is implemented by means of a Printed Circuit Board (PCB) 310.

The conductive plate 396 on an outer layer 320 of the PCB 310 is visible. The conductive plate 396 forms a capacitor plate. The outer layer comprises a first terminal 320. The terminal provides electrical connectivity to the conductive plate 396. The outer plate comprises a second terminal, 330, which is connected to the second conductive plate. The first and second terminals 320, 330 are used for adjusting the characteristic frequency response or resonant frequency by fitting a surface mount capacitor (not shown) in parallel with the capacitor plate formed on the PCB. As such, it is possible to discriminate between passive antennae with different resonant frequencies.

For example, if a first passive antenna is covered by a sliding sleeve being in an open state and is exposed (i.e. visible to a reader tool) when the sliding sleeve is in a closed state, then an indication of the sleeve being in an open or closed state may be detected. If at least one further antenna, configured to resonate at a different frequency from the first passive antenna, is located at another position of the sliding sleeve, then a positive indication of a degree of movement of the sliding sleeve can be achieved.

Further, the first and second terminals 320, 330 can be used to provide a means for testing the antenna and/or measuring characteristics of the antenna.

Figure 5:
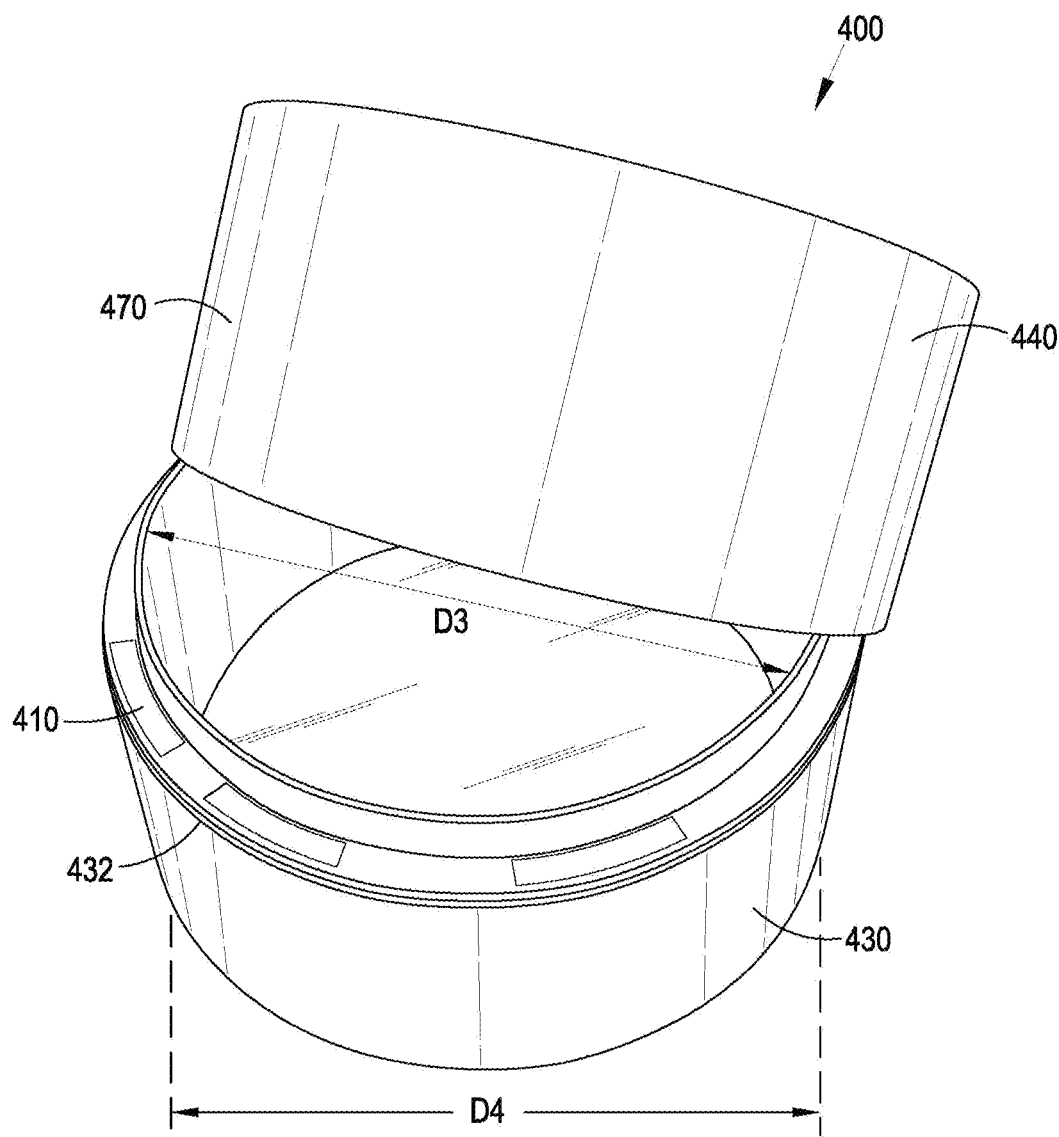
FIG. 5 is a photograph of an embodiment of an antenna assembly according to the fourth aspect of the disclosure, and comprising the antenna of FIG. 3.

FIG. 5 is a photograph of an exemplary embodiment of an antenna assembly 400 according to the fourth aspect of the disclosure, and comprising the antenna 410 of FIG. 3.

The enclosure 420 comprises a mouldable material capable of withstanding high rates of change of temperature and/or pressure.

The enclosure 420 comprises a primary enclosure component 430. The primary enclosure component 430 is rigid. The primary enclosure component 430 provides structural support to the antenna 410. The primary enclosure component 430 provides structural support to the antenna 410 during an ensuing over-moulding process.

The primary enclosure component 430 is substantially cylindrical. The primary enclosure component 430 is substantially tubular.

An exterior surface 450 of the primary enclosure component 430 comprises a shoulder or ridge 432. The ridge 432 is arranged in a plane (not shown) that is orthogonal to a longitudinal axis of the tubular primary enclosure component 430.

The ridge has a circumferential extent 360° relative to the axis.

An interior diameter D3 of the primary enclosure component 430 is substantially constant. An exterior diameter D4 of the primary enclosure component 430 is substantially constant.

The enclosure comprises a secondary enclosure component 440. The secondary enclosure 440 is rigid. The secondary enclosure component 440 also provides structural support the antenna 410.

The secondary enclosure component 440 is substantially cylindrical. The secondary enclosure component 440 is substantially tubular.

An exterior diameter of the secondary enclosure 440 is substantially constant.

An exterior diameter of the secondary enclosure component 440 is substantially constant.

The primary enclosure component and the secondary enclosure component 440 can be connected such that the antenna is completely enclosed by the primary 430 and secondary enclosure component 440.

Figure 6:
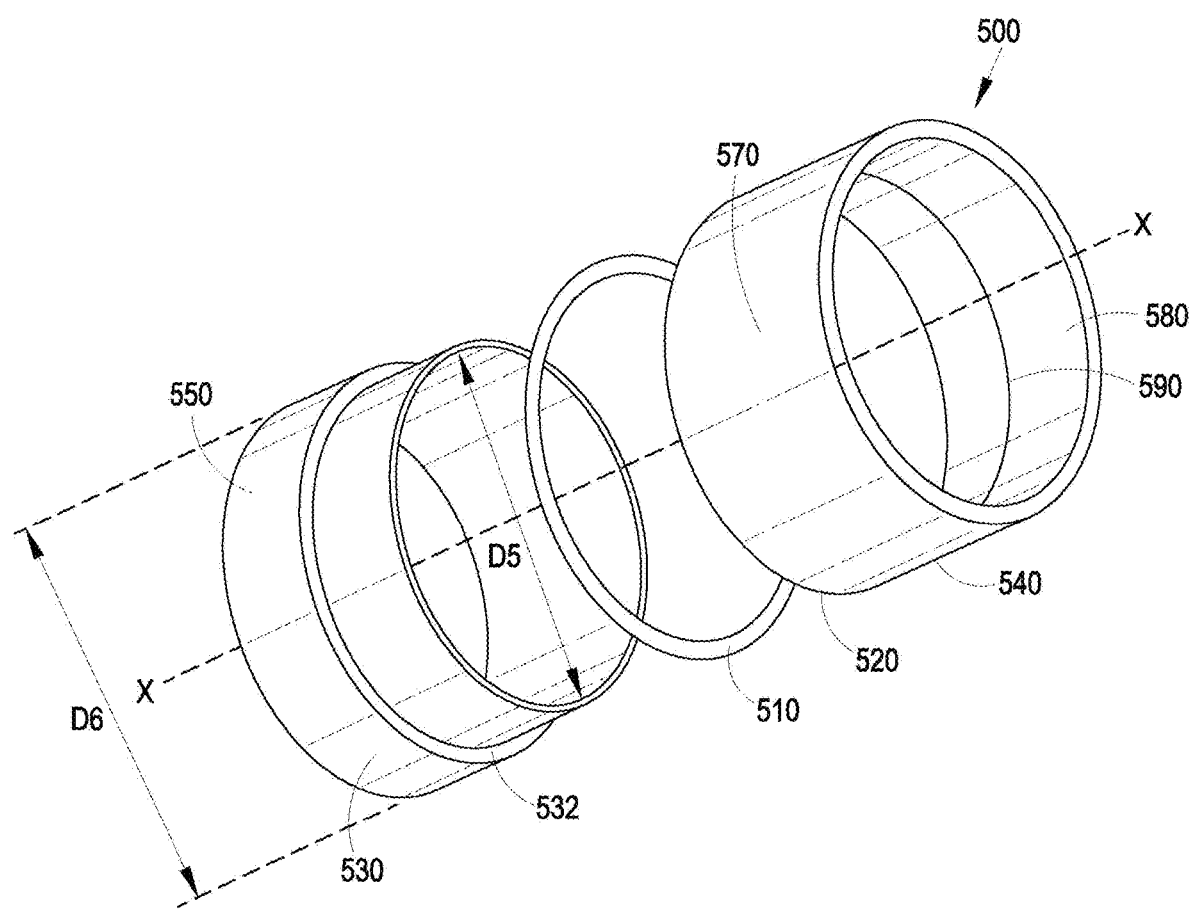
FIG. 6 is a diagram showing a perspective and exploded view of the antenna assembly of FIG. 5.

FIG. 6 is a diagram of an antenna assembly 500, which is a perspective and exploded view of the antenna assembly 400 of FIG. 5.

The enclosure 520 comprises a mouldable material capable of withstanding high rates of change of temperature and/or pressure.

The enclosure 520 comprises a primary enclosure component 530. The primary enclosure component 530 is rigid. The primary enclosure component 530 provides structural support to the antenna 510. The primary enclosure component 530 provides structural support to the antenna 510 during an ensuing over-moulding process.

The primary enclosure component 530 is substantially cylindrical. The primary enclosure component 530 is substantially tubular.

An exterior surface 550 of the primary enclosure component 530 comprises a shoulder 532. The shoulder 532 is arranged in a plane (not shown) that is orthogonal to a longitudinal axis X of the tubular primary enclosure component 530.

The ridge has a circumferential extent 360° relative to the axis.

An interior diameter D5 of the primary enclosure component 530 is substantially constant. An exterior diameter D6 of the primary enclosure component 530 is substantially constant.

The enclosure comprises a secondary enclosure component 540. The secondary enclosure 540 is rigid. The secondary enclosure component 540 also provides structural support the antenna 510.

The secondary enclosure component 540 is substantially cylindrical. The secondary enclosure component 540 is substantially tubular.

An interior surface 580 of the secondary enclosure component comprises a further ridge 590. The further ridge is arranged in a plane that is orthogonal to a longitudinal axis of the substantially tubular secondary enclosure component 540.

The further ridge 590 has a circumferential extent of 360° relative to the axis.

The further ridge 590 or shoulder has a circumferential extent of 360° relative to an axis of a throughbore.

An exterior diameter of the secondary enclosure 540 is substantially constant.

An exterior diameter of the secondary enclosure component 540 is substantially constant.

The primary enclosure component 530 and the secondary enclosure component 540 can be connected such that the antenna 510 is completely enclosed by the primary 530 and secondary enclosure component 540.

Figure 7:
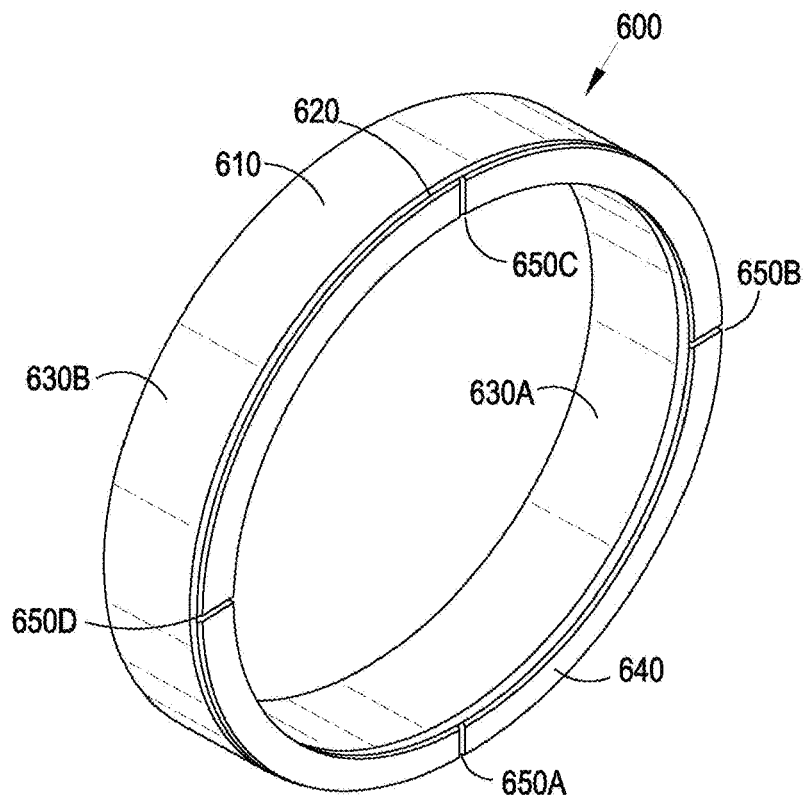
FIG. 7 is a diagram showing an alternative embodiment of an antenna assembly according to the fourth aspect of the disclosure.

FIG. 7 is a diagram showing an alternative embodiment of an antenna assembly 600 according to the fourth aspect of the disclosure, and comprising the antenna of FIG. 3.

The enclosure comprises a primary enclosure component 610. The primary enclosure component 610 is rigid. The primary enclosure component 610 provides structural support to the antenna.

The primary enclosure component 610 is substantially cylindrical. The primary enclosure component 610 is substantially tubular.

The enclosure comprises a secondary enclosure component 620. The secondary enclosure component 620 is rigid.

The secondary enclosure component 620 is substantially cylindrical. The secondary enclosure component 620 is substantially tubular.

The secondary enclosure component 620 comprises a plurality of indentations 650A-D on a surface 640 arranged substantially orthogonal to an inner surface 630A and an outer surface 630B of the antenna assembly 600. The indentations 650A-D are radially distributed around the outer surface 630A of the secondary enclosure component 620. Beneficially, the indentations 650A-D may increase a friction between the antenna assembly 600 and a further attachment, seat or shoulder (not shown) to minimise a rotational movement of the antenna assembly 600 in use or in installation.

The antenna assembly shown in FIG. 6 houses a passive antenna, as will be described with reference to FIG. 8.

Figure 8:
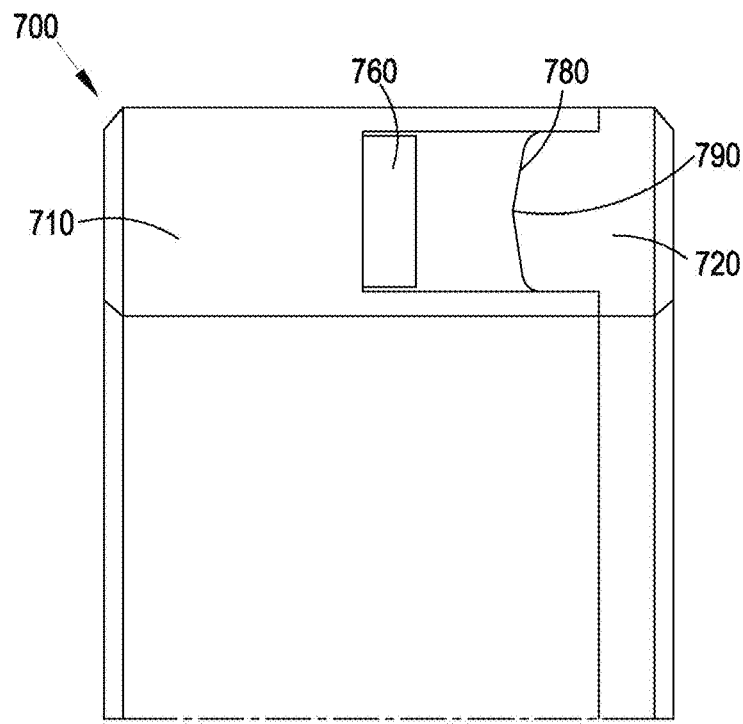
FIG. 8 is a diagram showing a cross-section of the antenna assembly of FIG. 7.

FIG. 8 shows an antenna assembly 700, which is a cross-section of the antenna assembly 600 of FIG. 7. The antenna assembly comprises an antenna 760. The antenna 760 is a passive antenna. The enclosure comprises a primary enclosure component 710 and a secondary enclosure component 720. Both the primary and secondary enclosure components 710 and 720 are rigid. A void 750 between the primary and secondary enclosure components is filled with an epoxy resin 760.

A surface 780 of the secondary enclosure is provided with a peak 790. The peak 790 extends circumferentially around the secondary enclosure. The arrangement of the peak 790 serves to displace epoxy resin 760 from the void 750 during assembly of the antenna assembly 700. The arrangement of the peak 790 serves to avoid air bubbles becoming trapped within the antenna assembly 700 during assembly. This is advantageous because the presence of air within the antenna assembly 700 may, in use, contribute to a failure of the antenna assembly 700. Air trapped within the antenna assembly may impact the integrity of the antenna assembly because of an expansion or contraction of the volume of air due to variations in temperature.

Figure 9:
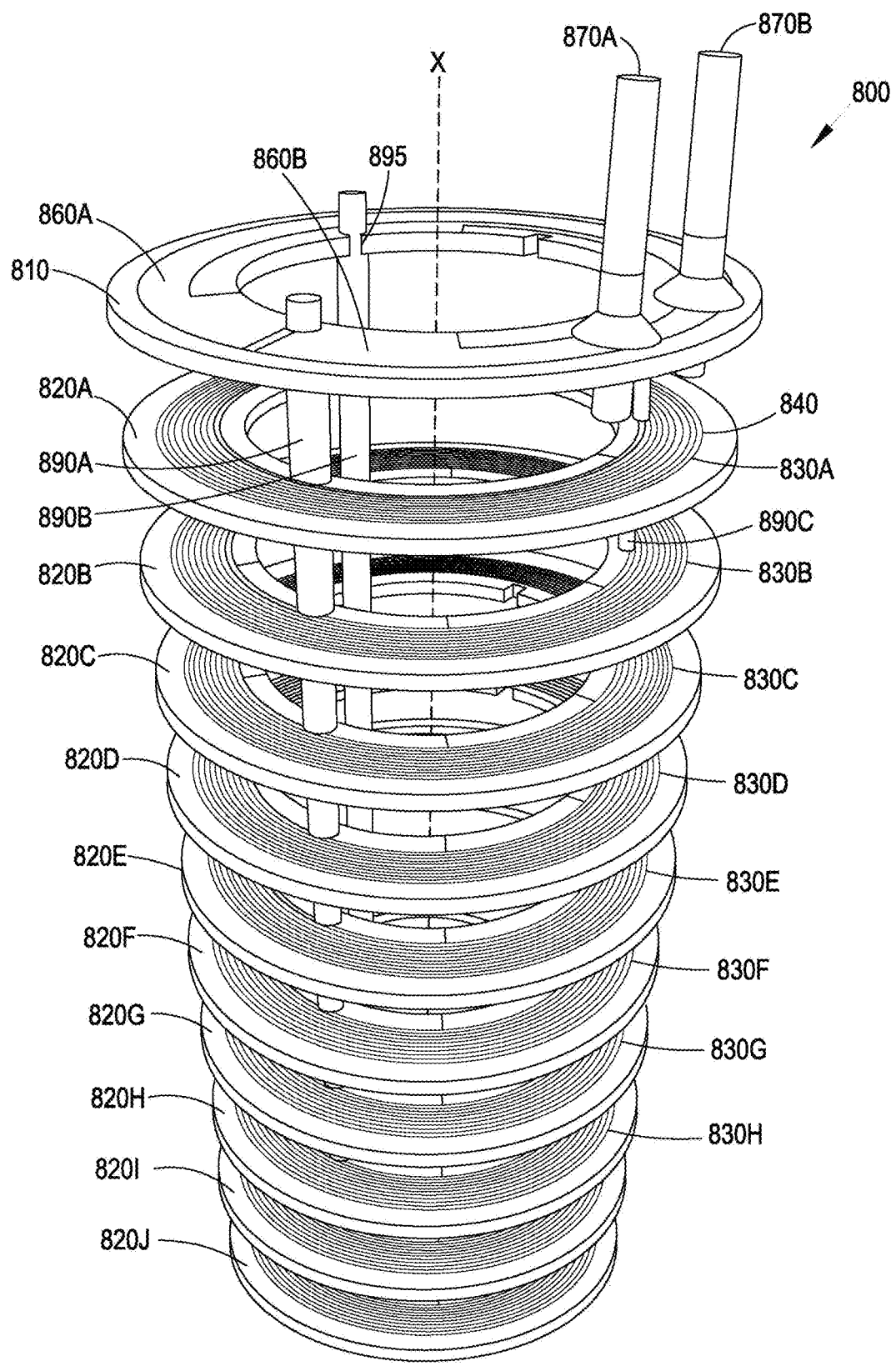
FIG. 9 is a photograph of a further embodiment of an antenna according to a first embodiment of the present disclosure.

FIG. 9 is a photograph of a further embodiment of an antenna 800 according to a first embodiment of the present disclosure. The antenna 800 is an active antenna. The antenna comprises a plurality of PCBs 820A-J and a further PCB 810. Each PCB 820A-J comprises two conductive layers. The PCBs 820A-J each comprise a conductive coil 830A-J on a top surface and a conductive coil 830A-J on a bottom surface (not shown). The plurality of PCBs 820A-J and the further PCB 810 are spaced apart by a distance D7. The plurality of PCBs 820A-J and the further PCB 810 comprise polyimide high temperature PCB's such as P96 or VT901.

Each PCB of the plurality of PCBs 820A-J and the further PCB 810 is substantially circular, with a centre cut out.

The conductive coils 830A-J comprise copper.

The conductive coils 830A-J exhibit characteristics of an Archimedean spiral in that a spacing 840 between each winding is constant. That is, each winding of the coil is a substantially constant distance from an adjacent winding of the coil.

In the exemplary embodiment of FIG. 9, each coil has 10 complete turns. One of skill in the art would recognise that in equivalent embodiments the design may be adapted to include fewer or more turns, or that the turns may not be complete, that is, exhibiting a 360° circumferential extent.

The conductive coil 830A-J formed on the conductive layer of the top surface of a PCB 820A-J is arranged to form a pair with the conductive coil formed on the conductive layer of the bottom surface of a PCB. The coils forming a pair of coils are electrically connected to one another, such that the coils are electrically connected in series. The coils forming a pair are arranged such that current flows in substantially the same direction in each coil.

The first coil of a pair of coils is electrically connected to the second coil of the pair of coils by a via 850.

The pairs of coils on each of the PCBs 820A-J are electrically connected by means of connecting member 890A. A bottom side of an upper PCB 810 is connected via the connecting member 890A to a top side of a PCB below 820A. A section of the connecting member 890A that inserts into each PCB comprising at least one conductive coil 820A-J is electrically isolated over the thickness of each PCB comprising at least one conductive coil 820A-J. An electrical connection is then made on a bottom side of the PCB 820A via the connecting member 890A to a top side of PCB 820B below. This sequence of connections continues all the way to a bottom of the antenna wherein a bottom side of the bottom PCB 820J connects to the other side of the connecting member 890A which is electrically connected all the way back to the upper PCB 810.

As such, the antenna 800 exhibits and electrical inductance that comprises the inductance of each pair of coils, together with any mutual inductance between each pair of coils and between each PCB 820A-J. In use, the antenna 800 forms the inductor component of a resonant circuit. In use, such a resonant circuit provides a characteristic electromagnetic field related to the characteristic resonant frequency of the circuit, and the circuit exhibits a characteristic resonant frequency response. That is, in use, the antenna 800 operates as a transmitter to energise a passive resonant antenna 200, 300, 410 that it is travelling through. After energising the passive antenna 200, 300, 410 it then operates as an inductive component of a tuned amplifier. That is, after energising the passive antenna 200, 300, 410, the antenna 800 then detects an electromagnetic field generated by the energized antenna.

The plurality of PCBs 820A-J and the further PCB 810 are substantially aligned along an axis X.

The axis X is orthogonal to a surface the plurality of PCBs 820A-J and the further PCB 810.

The plurality PCBs 820A-J and the further PCB 810 are centred on the axis X and aligned along axis X.

The surface of each of the plurality of PCBs 820A-J and the further PCB 810 is parallel to a surface another of the plurality of PCBs 820A-J and the further PCB 810.

The plurality of PCBs 820A-J and the further PCB 810 aligned along the axis X are substantially evenly spaced apart by distance D7.

The exemplary embodiment of the antenna of FIG. 9 comprises eleven PCBs 820A-J, 810, although one of skill in the art would recognise that to achieve a greater or lesser inductance, or to vary the characteristics of the antenna, the antenna may comprise fewer or more PCBs.

The antenna 800 comprises a further PCB 810, wherein the further PCB 810 comprises electrical contacts 860A, 860B. The electrical contacts 860A, 860B comprise conductive plates. An electrical contact 860A, 860B is conductively connected a conductive coil 830A of an uppermost PCB 820A comprising conductive coil 830A. An electrical contact on connecting member 890A is electrically connected to electrical contact 860A. A further electrical contact on connecting member 890A is electrically connected to electrical contact 860B.

A pair of further electrical contacts 870A, 870B is soldered to the electrical contacts 860A, 860B, such that conductive paths subsist between the further electrical contacts 870A, 870B and the electrical contact 860A, 860B. The further electrical contacts 870A, 870B are, in use, suitable for further connection to a cable, wire or other electrically conductive component. The further electrical contacts are, in use, also suitable for further connection to a conductor that is external to an enclosure, as is described by reference to FIGS. 8 and 9.

The plurality of PCBs 820A-J, and the further PCB 810, are mechanically and electrically connected by means of three connecting members 890A-C. The connecting members 890A-C comprise electrically conductive contacts 895.

The connecting members 890A-C are arranged such that flow of electrical current is permitted between each of the plurality of PCBs 820A-J, and the further PCB 810. The connection is formed by soldering. Such a connection is relatively robust, and provides structural support to the plurality of PCBs 820A-J and the further PCB 810 in addition to electrical connectivity.

The three connecting members 890A-C are radially positioned around axis X, wherein axis X is orthogonal to a conductive layer of each PCB 810, 820A-J, and wherein each PCB 810, 820A-J is centred on the axis. The connecting members 890A-C are connected to an inner diameter of the plurality of PCBs 820A-J, and the further PCB 810. One of connecting members 890A-C provides electrical connectivity between each of the plurality PCBs 820A-J and the further PCB 810. All connecting members 890A-C provide structural support One of skill in the art would recognize that the disclosure is not intended to be limited to the provision of exactly three connecting members. In other embodiments, more than three connecting members can be implemented. For example, valid design selections include the use of four, five or six connecting members.

Similarly, one of skill in the art would similarly recognise that in other embodiments that adhere to the principles of the described disclosure, the plurality of PCB may comprise fewer than 10 or more than 10 PCBs.

Figure 10:
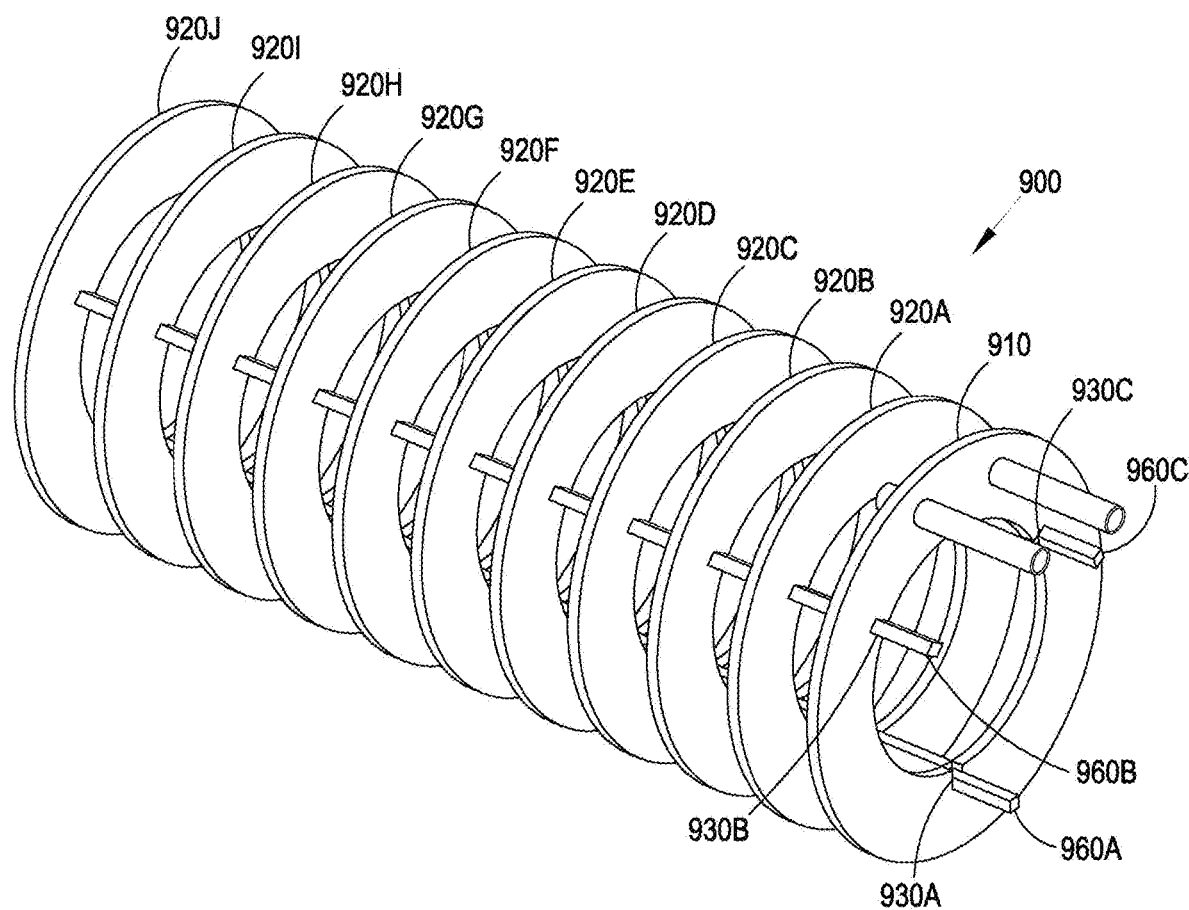
FIG. 10 is a diagram of an antenna, which is a simplified perspective view of the antenna of FIG. 9.

FIG. 10 is a diagram of an antenna 900, which is a simplified perspective view of the antenna 900 of FIG. 9. As can be seen from FIG. 10, each of the plurality of PCBs 910, 920A-J comprises three indentations 930A-C on an inner circumference of the PCB. The indentations 930A-C, in use with the connecting members 960A-C, serve to prevent axial motion of the PCBs 910, 920A-J relative to one another.

Figure 11:
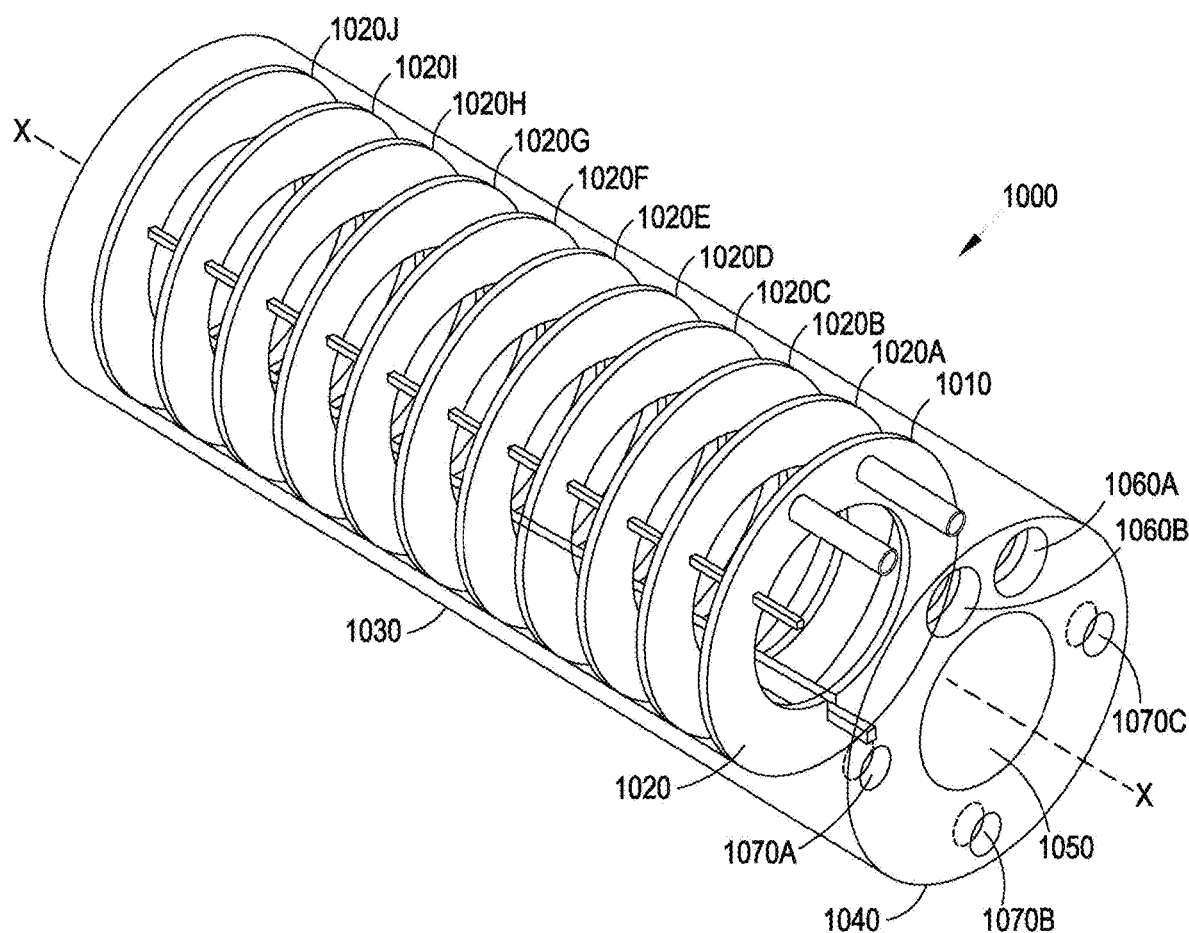
FIG. 11 is a perspective view of another embodiment of the antenna assembly according to the fourth aspect, and comprising an antenna according to FIGS. 9 and 10.

FIG. 11 is a perspective view of another embodiment of an antenna assembly 1000 according to the fourth aspect, and comprising an antenna according to FIGS. 7 and 8. The antenna 1010 is housed within an enclosure 1020. The enclosure comprises a plurality of enclosure components. The enclosure comprises a mouldable material, capable of withstanding high temperatures and high pressures. The mouldable material is relatively transparent to an electromagnetic field in a frequency range of operation.

The enclosure comprises a primary enclosure component (not shown), around which a plurality of PCBs 1010, 1020A-J are arranged. The primary enclosure component is rigid. The primary enclosure component provides structural support to antenna 1000.

The enclosure comprises a secondary enclosure component 1030. The secondary enclosure component 1030 comprises a mouldable material. The secondary enclosure component 1030 provides structural support to the antenna.

The secondary enclosure component 1030 is substantially cylindrical.

An exterior diameter of the secondary enclosure component is substantially constant.

The secondary enclosure component 1030 is moulded on to the antenna and the primary enclosure component.

The antenna is hermetically sealed within the enclosure with the exception of two electrical contacts.

The assembly is substantially tubular

The assembly comprises a base plate 1040. The base plate 1040 is part of the second enclosure 1030 component.

The base plate 1040 comprises a primary hole 1050.

The base plate 1040 comprises two holes 1060A, 1060B providing a means to form a conductive path between the antenna 1000 and further conductors. The holes 1060A, 1060B form sealed sockets once over moulded.

The base plate 1040 comprises three indentations 1070A-C. The indentations 1070A-C are radially positioned around axis Z. The indentations are each configured to form a receptacle or socket. The indentations provide rotational locking to prevent damage to connections made to the sockets.

Figure 12:
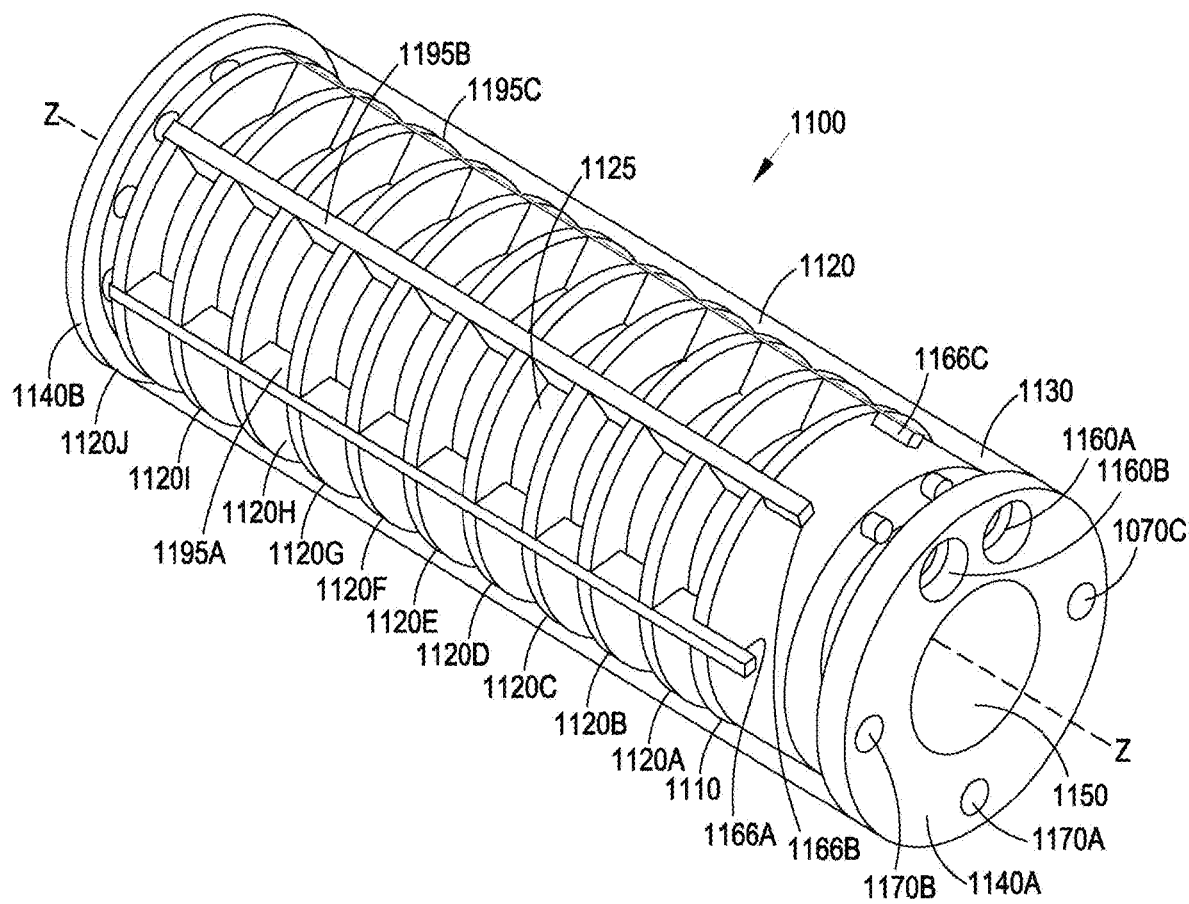
FIG. 12 is a diagram showing an alternative embodiment of an antenna assembly according to a fourth embodiment comprising an antenna according to a first embodiment of the disclosure.

FIG. 12 shows a diagram showing an alternative embodiment of an antenna assembly 1100 according to a fourth embodiment comprising an antenna 1105 according to a first embodiment of the disclosure. The antenna 1105 is housed within an enclosure 1120. The enclosure 1120 comprises a plurality of enclosure components. The enclosure 1120 comprises a rigid material, capable of withstanding high temperatures and high pressures. The rigid material is relatively transparent to an electromagnetic field in a frequency range of operation.

The enclosure 1120 comprises a primary enclosure component 1125, around which a plurality of PCBs 1110, 1120A-J are arranged. The primary enclosure component 1125 is rigid. The primary enclosure component 1125 provides structural support to antenna 1105.

The enclosure comprises a secondary enclosure component 1130. In FIG. 12, the secondary enclosure component 1130 is presented as transparent for illustrative purposes. The secondary enclosure component 1130 comprises a rigid material. The secondary enclosure component 1130 provides structural support to the antenna 1105.

The assembly 1100 is substantially tubular

The assembly 1110 comprises a base plate 1140A arranged at an end of the antenna assembly 1100. The assembly 1110 comprises a further base plate 1140B arranged at another end of the antenna assembly 1100.

The base plate 1140A is part of the primary enclosure component.

The base plates 1140A-B comprise primary holes 1150A.

The base plate 1140A comprises two holes 1160A, 1160B providing a means to form a conductive path between the antenna 1100 and further conductors. The holes 1160A, 1160B form sealed sockets.

The base plate 1140 comprises three indentations 1170A-C. The indentations 870A-C are radially positioned around axis Z, wherein the axis is substantially orthogonal to the plurality of PCBs 1110, 1120A-J. The indentations 1170A-C are each configured to form a receptacle or socket. The indentations 1170A-C provide rotational locking to prevent damage to connections made to the sockets.

The antenna 1105 comprises 6 connecting members 1195A-C (three of which are visible on FIG. 12) radially positioned around an axis Z.

The connecting members 1195A-C span a width of each PCB 1110, 1120A-J. That is, the connecting members 1195A-C are arranged such that an outward facing surface of the connecting members is substantially in alignment with an outer diameter of the plurality of PCBs 1110, 1120A-J. Further, the connecting members 1195A-C are arranged such that an inward facing surface of the connecting members is substantially in alignment with an inner diameter of the plurality of PCBs 1110, 1120A-J.

The primary enclosure component comprises a shoulder 1165. The shoulder 1165 comprises six indentations (three of which are visible in FIG. 12, 1166A-C) radially positioned around axis Z. An end of each connecting member 1195A-C is located within each of the six indentations 1166A-C in the shoulder 1165. Beneficially, the location of the connecting members 1195A-C within the indentations 1166A-C in the shoulder 1165 prevents rotation of the antenna 1105 relative to the enclosure 1120.

A surface of the shoulder 1165 is in contact with a surface of PCB 1110. Beneficially, such an arrangement prevents movement of the antenna 1105 in a direction along axis Z relative to the enclosure 1120.

Figure 13:
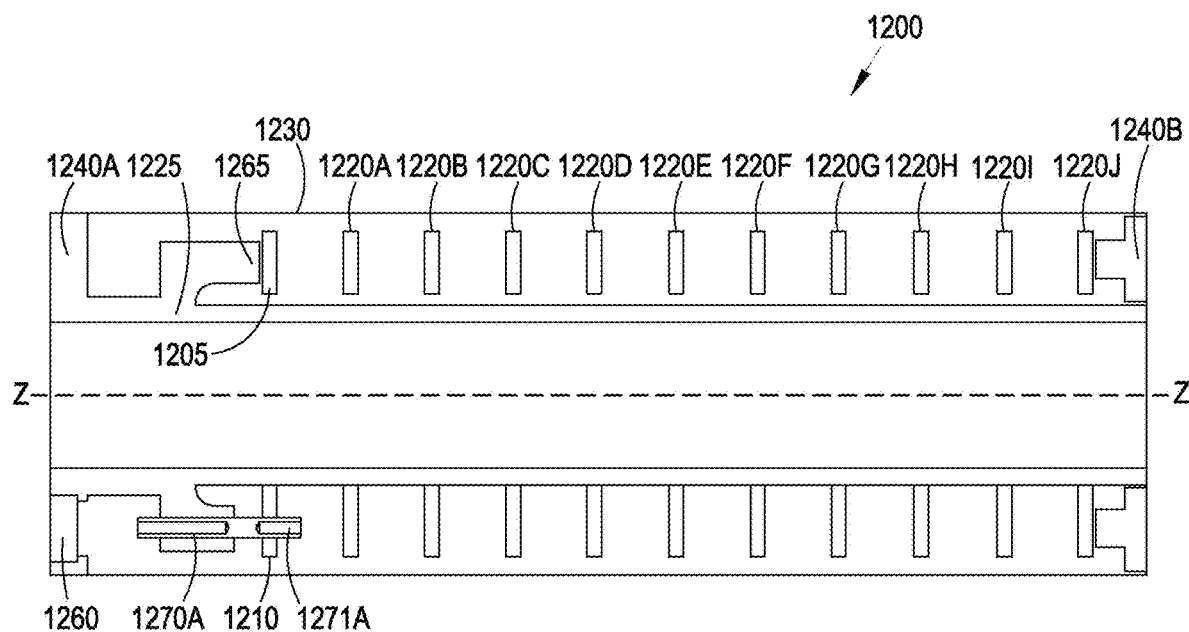
FIG. 13 is a diagram showing a cross-section of the antenna assembly of FIG. 12.

FIG. 13 shows an antenna assembly 1200, which is a cross-section of the antenna assembly 1100 of FIG. 12.

The antenna 1205 is housed within an enclosure 1220. The enclosure 1220 comprises a plurality of enclosure components. The enclosure 1220 comprises a rigid material, capable of withstanding high temperatures and high pressures. The rigid material is relatively transparent to an electromagnetic field in a frequency range of operation.

The enclosure 1220 comprises a primary enclosure component 1225, around which a plurality of PCBs 1210, 1220A-J are arranged. The primary enclosure component 1225 is rigid. The primary enclosure component 1225 provides structural support to antenna 1205.

The enclosure comprises a secondary enclosure component 1230. The secondary enclosure component 1230 comprises a rigid material. The secondary enclosure component 1230 provides structural support to the antenna 1205.

An exterior diameter of the secondary enclosure component 1230 is substantially constant.

The assembly 1200 is substantially tubular.

The assembly 1200 comprises a base plate 1240A arranged at an end of the antenna assembly 1200. The assembly 1200 comprises a further base plate 1240B arranged at another end of the antenna assembly 1200.

The base plate 1240A is part of the primary enclosure component 1225.

The base plates 1240A-B comprise primary holes 1250A.

The base plate 1240A comprises holes 1260 providing a means to form a conductive path between the antenna 1200 and further conductors. The holes 1260 form sealed sockets.

The primary enclosure component 1225 comprises a shoulder 1265. A surface of the shoulder 1265 is in contact with a surface of PCB 1210. Beneficially, such an arrangement prevents movement of the antenna 1205 in a direction along axis Z relative to the enclosure 1220.

Similarly, the base plate 1240B comprises a shoulder 1266. A surface of the shoulder 1266 is in contact with a surface of PCB 1220J. Beneficially, such an arrangement prevents movement of the antenna 1205 in a direction along axis Z relative to the enclosure 1220.

A pair of further electrical contacts, of which one is visible in FIG. 13, 1270A, is soldered to electrical contacts 1271A on PCB 1210, such that conductive paths subsist between the further electrical contacts 1270A and the electrical contact 1271A on PCB 1210. The electrical contacts 1271A are, in use, suitable for further connection to a cable, wire or other electrically conductive component inserted through holes 1260.

Figure 14:
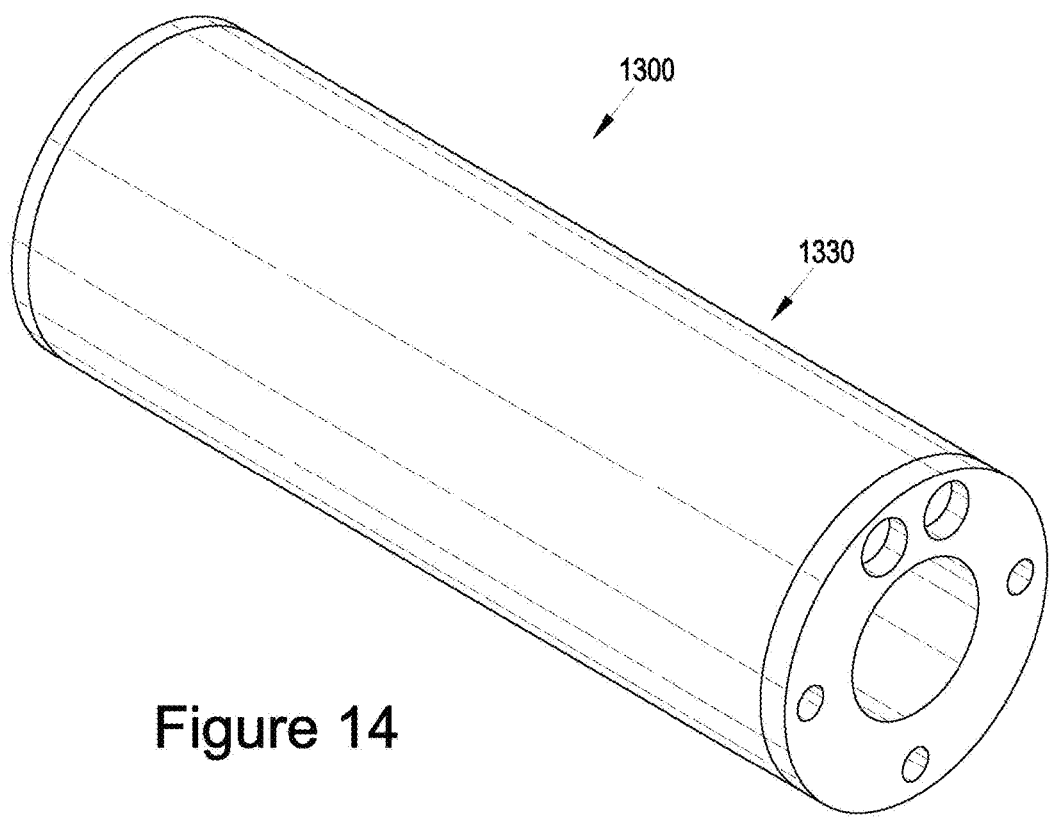
FIG. 14 is a perspective view of another embodiment of the antenna assembly according to the fourth aspect of the present disclosure.

FIG. 14 shows an antenna assembly 1300, which is a further view of the antenna assembly 1100 of FIG. 12. In FIG. 14, unlike in FIG. 12, the secondary enclosure component 1330 is presented as opaque.

Figure 15:
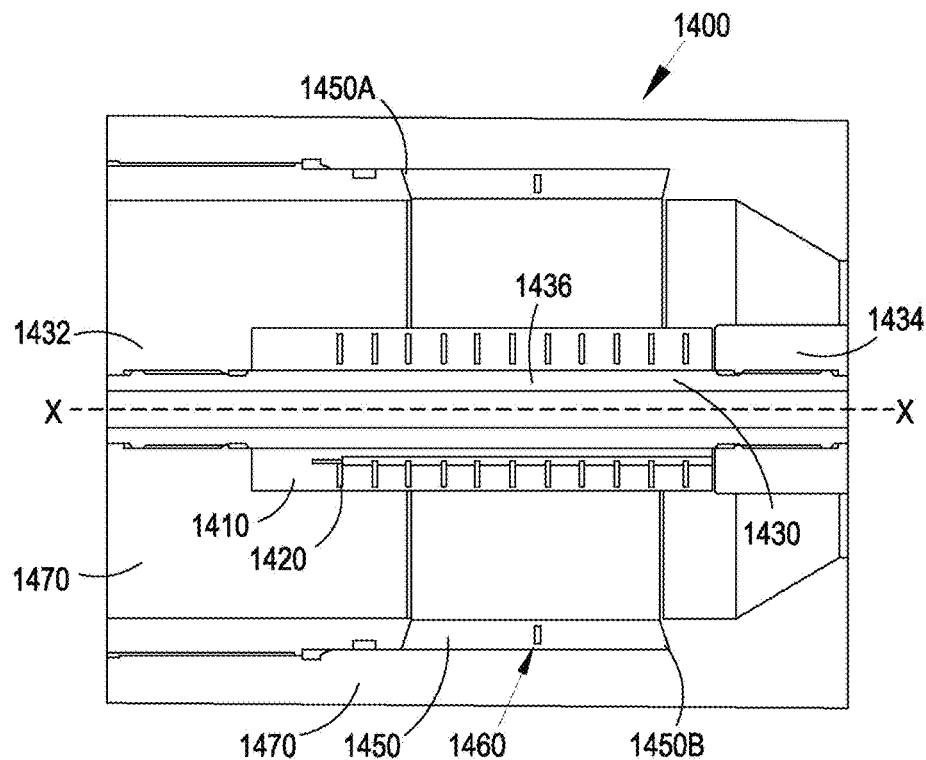
FIG. 15 is a cross-section of a system for use in downhole communication or detection according to the second aspect of the present disclosure.

FIG. 15 shows a cross-section of a system 1400 for use in downhole communication or detection. Antenna assembly 1410 comprises an active antenna 1420. The antenna assembly 1410 is attached to a deployable tool 1430. The deployable tool 1430 comprises a first component 1432 and a second component 1434. The antenna assembly is positioned between and abutting the first component 1432 and the second component 1434, such that the first component 1432, the antenna assembly 1410 and the second component 1434 are arranged longitudinally along a common axis X. The deployable tool 1430 further comprises a mounting 1436 which is positioned such that the antenna assembly surrounds the mounting 1436. An end of the mounting 1436 is affixed to the first component 1432 of the deployable tool 1430. An opposite end of the mounting 1436 is affixed to the second component 1434 of the deployable tool 1430.

Antenna assembly 1450 comprises a passive antenna 1460. Antenna assembly 1450 is mounted on downhole arrangement 1470. Antenna assembly 1450 is prevented from movement relative to downhole arrangement 1470 in a direction along axis X by means of circumferentially arranged dovetailed joints 1450A, 1450B. One of skill in the art would appreciate that the antenna assemblies of FIG. 5, 6, 7 or 8, each comprising a passive antenna, is an alternative configuration.

In the described arrangement, the deployable tool is movable along the throughbore 1470 of the downhole arrangement so that, in use, the active antenna passes the passive antenna.

The passive antenna is configured such that coupling of the electromagnetic field between the active and passive antennae as a function of frequency of an electrical signal applied to the active antenna provides a corresponding measured electrical signal on the active antenna having a characteristic frequency spectrum.

Figure 16:
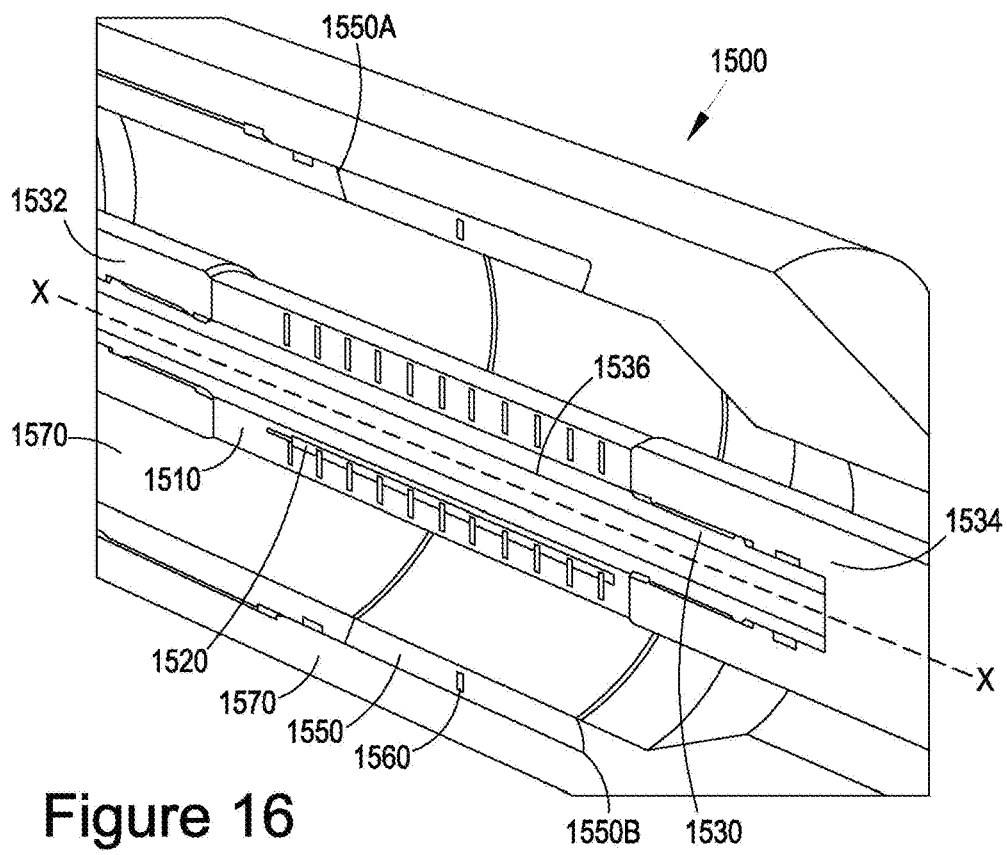
FIG. 16 is a perspective view of the system of FIG. 15.

FIG. 16 shows a system 1500 which is a perspective view of the system 1400 of FIG. 15. Antenna assembly 1510 comprises an active antenna 1520. The antenna assembly 1510 is attached to a deployable tool 1530. The deployable tool 1530 comprises a first component 1532 and a second component 1534. The antenna assembly is positioned between and abutting the first component 1532 and the second component 1534, such that the first component 1532, the antenna assembly 1510 and the second component 1534 are arranged longitudinally along a common axis X. The deployable tool 1530 further comprises a mounting 1536 which is positioned such that the antenna assembly surrounds the mounting 1536. An end of the mounting 1536 is affixed to the first component 1532 of the deployable tool 1530. An opposite end of the mounting 1536 is affixed to the second component 1534 of the deployable tool 1530.

Antenna assembly 1550 comprises a passive antenna 1560. Antenna assembly 1550 is mounted on downhole arrangement 1570. Antenna assembly 1550 is prevented from movement relative to downhole arrangement 1570 in a direction along axis X by means of circumferentially arranged dovetailed joints 1550A, 1550B. One of skill in the art would appreciate that the antenna assemblies of FIG. 5, 6, 7 or 8, each comprising a passive antenna, is an alternative configuration.

In the described arrangement, the deployable tool is movable along the throughbore 1570 of the downhole arrangement so that the active antenna passes the passive antenna.

It will be appreciated that the embodiments of the disclosure herebefore described are given by way of example only and are not meant to limit the scope of thereof in any way.

What is claimed is:

1. An antenna for use in downhole communication or detection, the antenna comprising:
   at least three printed circuit boards aligned along an axis; and
   a plurality of connecting members radially positioned around the axis,
   wherein connections are formed between the printed circuit boards and the connecting members, the connections providing structural support to the at least three printed circuit boards,
   wherein each of the printed circuit board comprise a planar substrate,
   wherein each of the planar substrates comprises at least one conductive coil,
   wherein each of the printed circuit boards are spaced apart and structurally supported by each of the connecting members, and
   wherein one of the connecting members provides electrical connectivity between each of the at least three printed circuit boards.

2. The antenna of claim 1, wherein the antenna is adapted to be provided on a downhole arrangement defining a throughbore.

3. The antenna of claim 1, wherein at least one of:
   the plurality of planar substrates comprises an insulator;
   the plurality of planar substrates comprises ceramic, glass fiber, epoxy laminate, FR-4, FR-6, Teflon, P96, VT901, an insulated metal substrate, a flexible material, Alumina (Aluminum Oxide), Polyimide, or PTFE; and
   each planar substrate of the plurality of planar substrates is substantially circular, disc shaped or annular.

4. The antenna of claim 1, wherein at least one of:
   the at least one conductive coil comprises copper, an alloy comprising copper, silver, tin, lead or conductive metal;
   the at least one conductive coil is coated in an insulating material;
   the at least one conductive coil comprises a spiral;
   the at least one conductive coil comprises wire;
   the at least one conductive coil comprises wire, the wire comprising a cross-section that is substantially circular;
   the at least one conductive coil comprises a plurality of turns;
   the at least one conductive coil comprises a plurality of windings, wherein each winding of the at least one conductive coil has a curvature which increases towards a center of the at least one conductive coil, each winding of the coil comprising one or more straight sections, and/or each winding of the at least one conductive coil extending around a different axis; and
   the at least one conductive coil is configured to and/or operate as an inductor.

5. The antenna of claim 1, wherein the antenna comprises a core, and wherein:
   the core is located within or surrounded by the at least one conductive coil; and/or
   the core is moveable and/or adjustable such that the amount of the core positioned within the at least one conductive coil can be varied.

6. The antenna of claim 1, wherein the antenna comprises a Printed Circuit Board (PCB) implemented as multiple-layer PCB comprising the at least one conductive coil implemented on each of a plurality of conductive layers.

7. The antenna of claim 6, wherein the at least one conductive coil on each of the plurality of conductive layers of the multiple-layer PCB are electrically connected in series.

8. The antenna of claim 7, wherein a pair of the conducive coils are instantiated such that a winding of a first of the pair of the conductive coils on a first of the conductive layers starts at an outermost loop of the first conductive coil, or each successive loop of the first conductive coil on the first conductive layer is connected to a successive loop of a second of the pair of the conductive coils on a second of the conductive layers.

9. The antenna of claim 1, wherein:
   the antenna comprises at least one capacitor, and/or
   the antenna comprises at least one capacitor, wherein the at least one capacitor is electrically connected to the at least one conductive coil; and/or wherein the at least one capacitor comprises at least a portion of each of at least two conductive layers of a multiple-layer PCB and/or wherein the antenna comprises a plurality of PCBs.

10. The antenna of claim 9, wherein the plurality of planar substrates or PCBs are spaced apart in planar relation and/or wherein the plurality of planar substrates or PCBs are spaced with material between each planar substrate or PCB, and/or wherein the plurality of planar substrates or PCBs are spaced with an elastomeric material and/or a polymeric material and/or a resin and/or a potting compound.

11. The antenna of claim 9, wherein the antenna further comprises a further PCB, wherein the further PCB comprises at least one electrical contact.

12. A system for use in downhole communication or detection, the system comprising:
   a downhole arrangement defining a throughbore;
   a primary antenna; and
   a secondary antenna;
   wherein at least one of the primary and secondary antennae comprise an antenna according to claim 1.

13. The system of claim 12, wherein one of the primary antenna and the secondary antennae is adapted to be moved relative to the other of the primary and secondary antennae to align the primary and secondary antenna.

14. The system of claim 12, wherein one of the primary and secondary antennae is provided on the downhole arrangement and the other of the primary and secondary antennae is provided in the throughbore, and the primary and secondary antennae are configurable for coupling of an electromagnetic field therebetween.

15. The system of claim 12, wherein the primary antenna is electrically active and the secondary antenna is electrically passive.

16. An antenna as claimed in claim 1, wherein the at least three printed circuit boards are evenly spaced apart.

* * * * *